(12) United States Patent
Yang et al.

(10) Patent No.: US 10,468,330 B2
(45) Date of Patent: Nov. 5, 2019

(54) SEMICONDUCTOR CHIP AND ELECTRONIC SYSTEM INCLUDING THE SAME

(71) Applicant: SAMSUNG ELECTRONICS CO., LTD., Suwon-si, Gyeonggi-do (KR)

(72) Inventors: Jun-Hyeok Yang, Seongnam-si (KR); Se-Ki Kim, Suwon-si (KR); Se-Ra An, Suwon-si (KR); Hyung-Jong Ko, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 514 days.

(21) Appl. No.: 14/565,525

(22) Filed: Dec. 10, 2014

(65) Prior Publication Data

US 2015/0170992 A1 Jun. 18, 2015

Related U.S. Application Data

(60) Provisional application No. 61/915,099, filed on Dec. 12, 2013.

(30) Foreign Application Priority Data

Feb. 4, 2014 (KR) .................. 10-2014-0012406

(51) Int. Cl.
*H01L 23/38* (2006.01)
*H01L 27/16* (2006.01)
(Continued)

(52) U.S. Cl.
CPC .............. *H01L 23/38* (2013.01); *H01L 27/16* (2013.01); *H01L 35/00* (2013.01); *H01L 35/02* (2013.01);
(Continued)

(58) Field of Classification Search
CPC ......... H01L 35/30; H01L 35/32; H01L 23/38; H01L 27/16
See application file for complete search history.

(56) References Cited

U.S. PATENT DOCUMENTS 6,614,109 B2 * 9/2003 Cordes .................... H01L 23/38
136/203
6,798,659 B2 9/2004 Chen
(Continued)

FOREIGN PATENT DOCUMENTS

| JP | 2007-234913 | 9/2007 |
|---|---|---|
| KR | 1020100067705 | 6/2010 |
| KR | 1020110066577 | 6/2011 |

OTHER PUBLICATIONS

"On". Dictionary.com Unabridged. Random House, Inc. Aug. 7, 2017. <Dictionary.com http://www.dictionary.com/browse/on>.*

*Primary Examiner* — Edward J. Schmiedel
(74) *Attorney, Agent, or Firm* — F. Chau & Associates, LLC

(57) ABSTRACT

A semiconductor chip includes a semiconductor circuit layer and a semiconductor thermoelectric layer disposed on a substrate. The circuit layer includes a first circuit and a second circuit disposed horizontally in a first direction. The thermoelectric layer includes a first on-die thermoelectric element, where the thermoelectric layer is disposed on the circuit layer including the first circuit and the second circuit. The first on-die thermoelectric element is configured to distribute heat generated at the first circuit horizontally in the first direction toward the second circuit.

17 Claims, 19 Drawing Sheets

(51) Int. Cl.
*H01L 35/28* (2006.01)
*H01L 35/32* (2006.01)
*H01L 35/02* (2006.01)
*H01L 35/00* (2006.01)

(52) U.S. Cl.
CPC .............. *H01L 35/28* (2013.01); *H01L 35/32* (2013.01); *H01L 2924/0002* (2013.01)

(56) References Cited

U.S. PATENT DOCUMENTS

| | | |
|---|---|---|
| 7,544,883 B2 | 6/2009 | Chen et al. |
| 7,656,027 B2 | 2/2010 | Dangelo et al. |
| 7,924,569 B2 | 4/2011 | Let |
| 8,462,499 B2 | 6/2013 | Nishioka et al. |
| 2004/0000333 A1* | 1/2004 | Chen ............... H01L 23/38 136/224 |
| 2004/0084781 A1* | 5/2004 | Ahn ............... G02B 6/4214 257/777 |
| 2005/0077619 A1* | 4/2005 | Ramanathan ........ H01L 23/38 257/719 |
| 2006/0076046 A1* | 4/2006 | Ghoshal ............. H01L 27/16 136/205 |
| 2006/0128059 A1 | 6/2006 | Ahn et al. |
| 2006/0145356 A1 | 7/2006 | Liu et al. |
| 2006/0270116 A1* | 11/2006 | Dangelo ............. B82Y 10/00 438/122 |
| 2009/0000652 A1* | 1/2009 | von Windheim ...... H01L 23/38 136/230 |
| 2009/0321909 A1 | 12/2009 | Gu et al. |
| 2010/0176506 A1* | 7/2010 | Hsu .............. H01L 23/481 257/698 |
| 2012/0132243 A1 | 5/2012 | Caillauit et al. |

\* cited by examiner

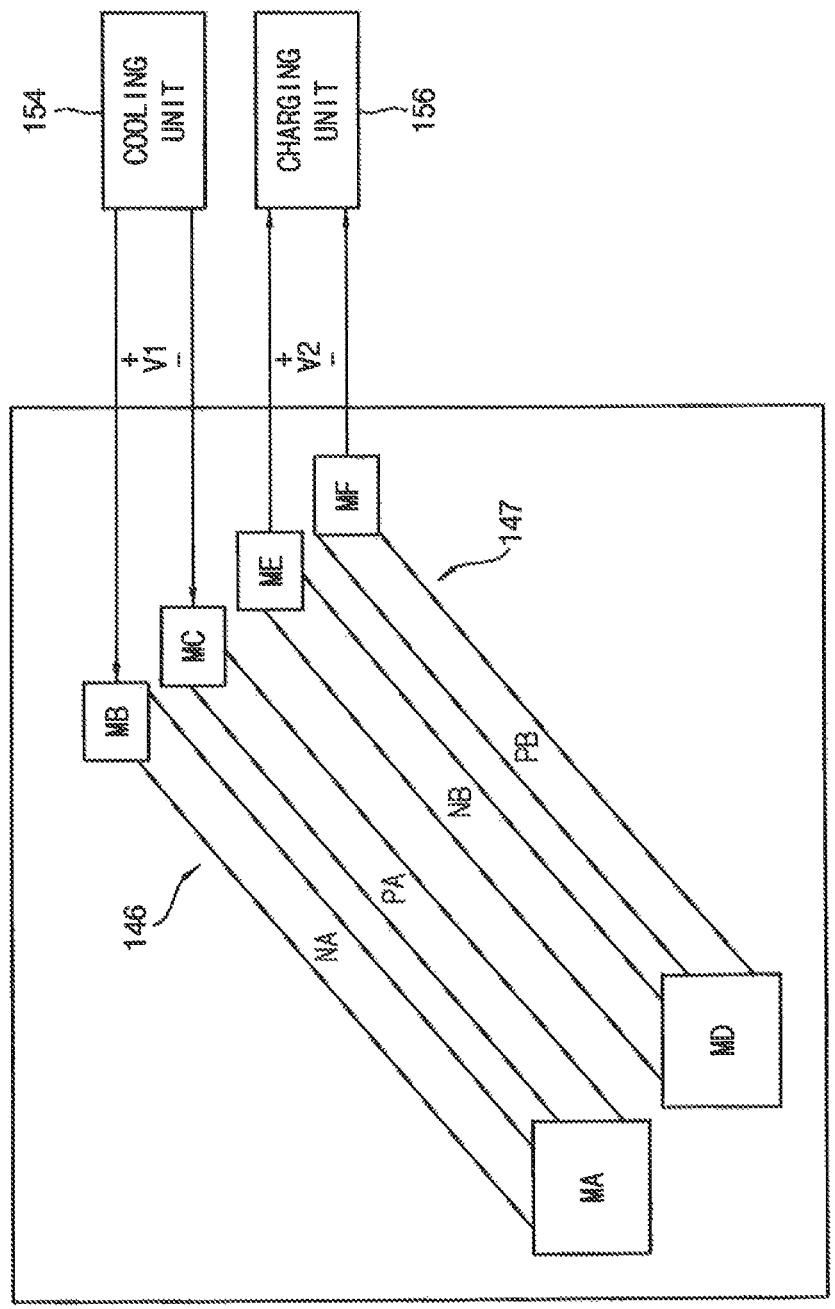

SEMICONDUCTOR CHIP AND ELECTRONIC SYSTEM INCLUDING THE SAME

CROSS-REFERENCE TO RELATED APPLICATION

This U.S. non-provisional application claims priority under 35 USC § 119 from U.S. Provisional Application No. 61/915,099 filed on Dec. 12, 2013 in the USPTO, and from Korean Patent Application No. 10-2014-0012406, filed on Feb. 4, 2014, in the Korean Intellectual Property Office (KIPO), and all the benefits accruing therefrom, the contents of which are herein incorporated by reference in their entirety.

BACKGROUND

1. Technical Field

Exemplary embodiments are generally directed to semiconductor integrated circuits, and more particularly to semiconductor chips and electronic systems including the semiconductor chips.

2. Description of the Related Art

As the degree of integration of semiconductor chips increases, a larger number of components may be integrated into one semiconductor chip, and the operation speed of the semiconductor chip gradually increases. As the degree of integration and the operation speed of the semiconductor chip increases, a greater amount of heat may be emitted within the semiconductor chip, and a local temperature difference may occur within the semiconductor chip due to the operating conditions thereof. Accordingly, recently, temperature or thermal management has been utilized for semiconductor chips.

A conventional semiconductor chip may have an additional thermoelectric element chip attached outside thereof, and thus the conventional semiconductor chip is relatively thick. Although a conventional semiconductor chip includes a thermoelectric element, an additional heat sink may be needed because heat generated at a hot spot is emitted vertically by the thermoelectric element.

SUMMARY

Some exemplary embodiments may provide a semiconductor chip capable of effectively distributing heat generated within the semiconductor chip.

Some exemplary embodiments may provide an electronic system including the semiconductor chip.

According to an exemplary embodiment of the inventive concept, there is provided a semiconductor chip that includes a semiconductor circuit layer and a semiconductor thermoelectric layer disposed on a substrate. The circuit layer includes a first circuit and a second circuit disposed horizontally in a first direction, and the thermoelectric layer includes a first on-die thermoelectric element. The thermoelectric layer is disposed on the circuit layer including the first circuit and the second circuit, and the first on-die thermoelectric element is configured to distribute heat generated at the first circuit horizontally in the first direction toward the second circuit.

In some embodiments, the first on-die thermoelectric element may be configured to generate electricity based on a temperature differential at the first circuit and the second circuit.

In some embodiments, the first thermoelectric element may include first and second electrodes corresponding to the first circuit and the second circuit, respectively.

In some embodiments, the semiconductor chip may further include a temperature sensor configured to measure temperature at the first circuit.

In some embodiments, the first on-die thermoelectric element may be activated to distribute heat in the first direction when the temperature at the first circuit is greater than a reference temperature.

In some embodiments, the semiconductor chip may further include a first temperature sensor and a second temperature sensor configured to measure temperature at the first circuit and the second circuit, respectively, where the first on-die thermoelectric element is activated to distribute heat in the first direction when the temperature differential is greater than a reference differential value.

In some embodiments, the first on-die thermoelectric element may be activated to distribute heat in the first direction based on a reference workload of the first circuit.

In some embodiments, the semiconductor chip may further include a controller configured to provide mode control signals including a heat distribution mode and a power generation mode. The heat distribution mode may provide an activating voltage to activate the first on-die thermoelectric element to distribute heat in the first direction, and the power generation mode may provide electricity generated by the first on-die thermoelectric element.

In some embodiments, the generated electricity may be provided to other circuits in the semiconductor chip or to recharge a power source.

In some embodiments, the semiconductor chip may further include a second thermoelectric layer including a second on-die thermoelectric element disposed on another surface of the circuit layer.

In some embodiments, the second on-die thermoelectric element may be configured to generate electricity based on the temperature difference at the first circuit and the second circuit.

In some embodiments, the semiconductor chip may further include a second thermoelectric layer including a second on-die thermoelectric element disposed on the first thermoelectric layer.

In some embodiments, the first thermoelectric layer may include a second thermoelectric element, the first thermoelectric element may be configured to distribute heat in the first direction and the second thermoelectric element may be configured to generate electricity based on a temperature differential between a third circuit and a fourth circuit.

In some embodiments, the first circuit may be one of an application processor (AP), a microprocessor or a central processing unit (CPU).

In some embodiments, the semiconductor chip may further include a dielectric layer disposed between the circuit layer and the thermoelectric layer.

In some embodiments, the semiconductor chip may further include a second thermoelectric layer disposed above the first thermoelectric layer, the second thermoelectric layer including at least one on-die thermoelectric element and a plurality of electrodes configured to perform horizontal heat distributing operation or energy generating operation.

According to another exemplary embodiment of the inventive concept, there is provided a semiconductor chip that includes a semiconductor circuit layer and a semiconductor thermoelectric layer disposed on a substrate. The circuit layer includes a first circuit and a second circuit disposed horizontally in a first direction, the thermoelectric layer includes a first on-die thermoelectric element, where the thermoelectric layer is disposed on the circuit layer including the first circuit and the second circuit, and the first on-die thermoelectric element is configured to generate electricity based on a temperature differential at the first circuit and the second circuit.

According to another exemplary embodiment of the inventive concept, there is provided an electronic device that includes a processor, a memory device, and a controller, where the processor is implemented as a semiconductor chip. The semiconductor chip includes a semiconductor circuit layer and a semiconductor thermoelectric layer disposed on a substrate, where the circuit layer includes a first circuit and a second circuit disposed horizontally in a first direction, and the thermoelectric layer includes a first on-die thermoelectric element. The thermoelectric layer is disposed on the circuit layer including the first circuit and the second circuit, and the thermoelectric element is configured to distribute heat generated at the first circuit horizontally in the first direction toward the second circuit.

In some embodiments, the electronic device may further include a second thermoelectric layer including a second on-die thermoelectric element disposed on another surface of the circuit layer.

In some embodiments, the memory device includes at least one volatile memory and at least one nonvolatile memory.

In some embodiments, the electronic device may further include a display panel and a display driver integrated circuit (DDI).

In some embodiments, the electronic device may further include an image sensing pixel array and the processor implemented as a semiconductor chip is a digital signal processor (DSP).

In some embodiments, the electronic device may further include a connectivity unit configured to wired or wirelessly communicate with an external device.

In some embodiments, the electronic device may further include

In some embodiments, the processor is configured to operate the functions of a smart phone, a tablet computer, or a digital camera.

According to another exemplary embodiment of the inventive concept, there is provided a method of heat redistribution in a semiconductor device, the method comprising: measuring the temperature of a first area of a circuit layer having a first circuit; comparing the temperature against a reference temperature; and activating a thermoelectric element disposed on the circuit layer to distribute heat generated from the first circuit to a second area of the circuit layer having a second circuit when the measured temperature exceeds the reference temperature, wherein the circuit layer is disposed horizontally on a substrate.

According to another exemplary embodiment of the inventive concept, there is provided A method of operating a semiconductor device, the method comprising: measuring the temperature of a first area of a circuit layer having a first circuit and the temperature of a second area of the circuit layer having a second circuit; comparing the temperature differential between the first circuit and the second circuit against a reference temperature difference; and activating a thermoelectric element disposed on the circuit layer to generate electricity based on the temperature differential when the measured temperature differential exceeds the reference temperature difference, wherein the circuit layer is disposed horizontally on a substrate.

BRIEF DESCRIPTION OF THE DRAWINGS

Illustrative, non-limiting exemplary embodiments will be more clearly understood from the following detailed description taken in conjunction with the accompanying drawings.

FIG. 15 is a plan view of a semiconductor chip according to exemplary embodiments.

DETAILED DESCRIPTION OF EXEMPLARY EMBODIMENTS

Figure 1A:
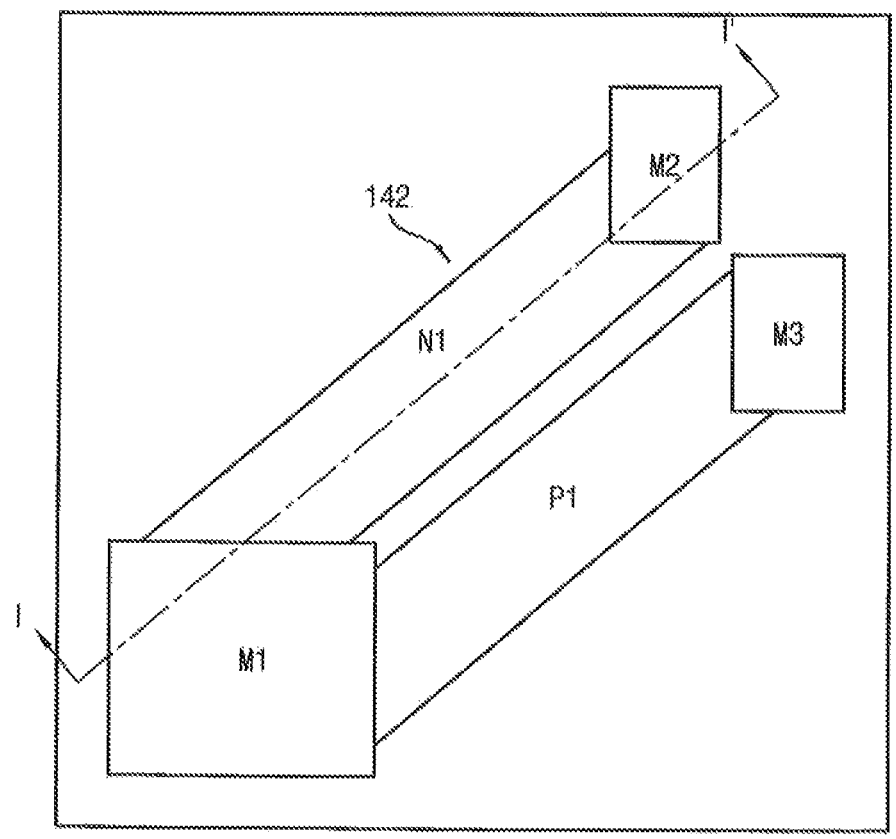
FIGS. 1A and 1B illustrate a semiconductor chip according to exemplary embodiments.

Various exemplary embodiments will be described more fully with reference to the accompanying drawings, in Which embodiments are shown. Embodiments of the inventive concept may, however, be embodied in many different forms and should not be construed as limited to the embodiments set forth herein. Like reference numerals may refer to like elements throughout this application.

It will be understood that when an element is referred to as being "connected" or "coupled" to another element, it can be directly connected or coupled to the other element or intervening elements may be present.

Figure 1B:
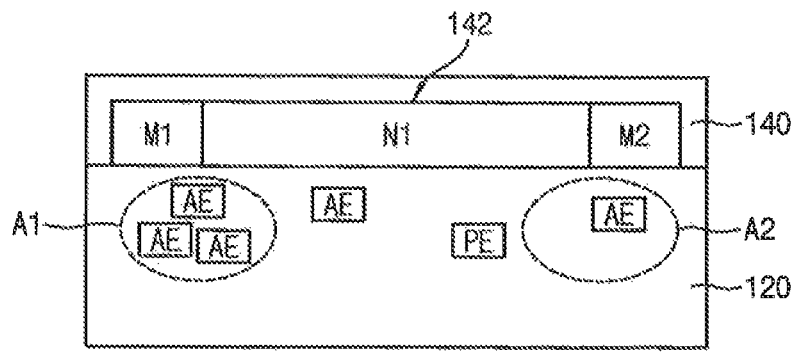

FIGS. 1A and 1B illustrate a semiconductor chip according to exemplary embodiments. FIG. 1A is a plan view of the semiconductor chip. FIG. 1B is a cross-sectional view of the semiconductor chip taken along a line I-I' of FIG. 1A.

Referring to FIGS. 1A and 1B, a semiconductor chip 100 includes a first circuit layer 120 and a first thermoelectric layer 140.

The first circuit layer 120 includes a plurality of active elements AE and a plurality of passive elements PE. The plurality of active elements AE and the plurality of passive elements PE may operate such that the semiconductor chip 100 computes predetermined functions or tasks. For example, the plurality of active elements AE may include a plurality of transistors, and the plurality of passive elements PE may include a plurality of resistors and/or a plurality of capacitors.

The first circuit layer 120 includes a first area A1 and a second area A2. The number of active elements and/or passive elements disposed in the first area A1 may be greater than the number of active elements and/or passive elements disposed in the second area A2, and thus a temperature of the first area A1 may be higher than a temperature of the second area A2 during a period when the semiconductor chip 100 operates. For example, the first area A1 may include a hot spot, which is an area that locally generates a greatest amount of heat within the first circuit layer 120. The second area A2 may be farthest from the first area A1 within the first circuit layer 120.

The first circuit layer 120 may include a first semiconductor substrate. The plurality of active elements AE, the plurality of passive elements PE and multiple layers of metallic lines may be disposed above and/or within the first semiconductor substrate.

The first thermoelectric layer 140 is disposed on one surface of the first circuit layer 120. For example, as illustrated in FIG. 1B, the first thermoelectric layer 140 may be disposed above the first circuit layer 120. Alternatively, the first thermoelectric layer 140 may be disposed below the first circuit layer 120.

The first thermoelectric layer 140 includes at least one first on-die thermoelectric element 142 that is integrated within the semiconductor chip 100. The at least one first on-die thermoelectric element 142 performs a horizontal heat distributing operation such that the heat generated by the first area A1 of the first circuit layer 120 is horizontally distributed from the first area A1 to the second area A2 of the first circuit layer 120. The horizontal heat distributing operation will be described in detail with reference to FIGS. 2, 3A and 3B.

In addition, the first thermoelectric layer 140 may include a second semiconductor substrate. The at least one first on-die thermoelectric element 142 may be disposed above and/or within the second semiconductor substrate.

In an exemplary embodiment, the at least one first on-die thermoelectric element 142 may further perform an energy generating operation to generate power from the heat generated by the first area A1 of the first circuit layer 120 and the plurality of active elements AE and the plurality of passive elements PE may operate based on that power. The energy generating operation will be described in detail with reference to FIG. 4.

In an exemplary embodiment, the at least one first on-die thermoelectric element 142 may include a first electrode M1, a second electrode M2, a third electrode M3, a first semiconductor region N1 and a second semiconductor region P1. The first electrode M1 may be disposed in the first thermoelectric layer 140 and may correspond to the first area A1 of the first circuit layer 120. The second electrode M2 and the third electrode M3 may be disposed in the first thermoelectric layer 140 and may correspond to the second area A2 of the first circuit layer 120. The third electrode M3 may be spaced apart from the second electrode M2. The first semiconductor region N1 may be disposed between the first electrode M1 and the second electrode M2 to connect the first electrode M1 with the second electrode M2. The second semiconductor region P1 may be disposed between the first electrode M1 and the third electrode M3 to connect the first electrode M1 with the third electrode M3. The first, second and third electrodes M1, M2 and M3 may include a metal. The first semiconductor region N1 may include an n-type semiconductor. The second semiconductor region P1 may include a p-type semiconductor. Various structures of on-die thermoelectric elements will be described in detail with reference to FIGS. 12, 13, 14A and 14B.

A semiconductor chip 100 according to exemplary embodiments includes the at least one first on-die thermoelectric element 142 integrated within the semiconductor chip 100 that performs a horizontal heat distributing operation. Accordingly, a hot spot in the semiconductor chip 100 may be effectively eliminated without increasing the thickness of the semiconductor chip 100 and without increasing the manufacturing cost the semiconductor chip 100. In addition, when the at least one first on-die thermoelectric element 142 further performs an energy generating operation, the semiconductor chip 100 may have an improved energy efficiency.

Figure 2:
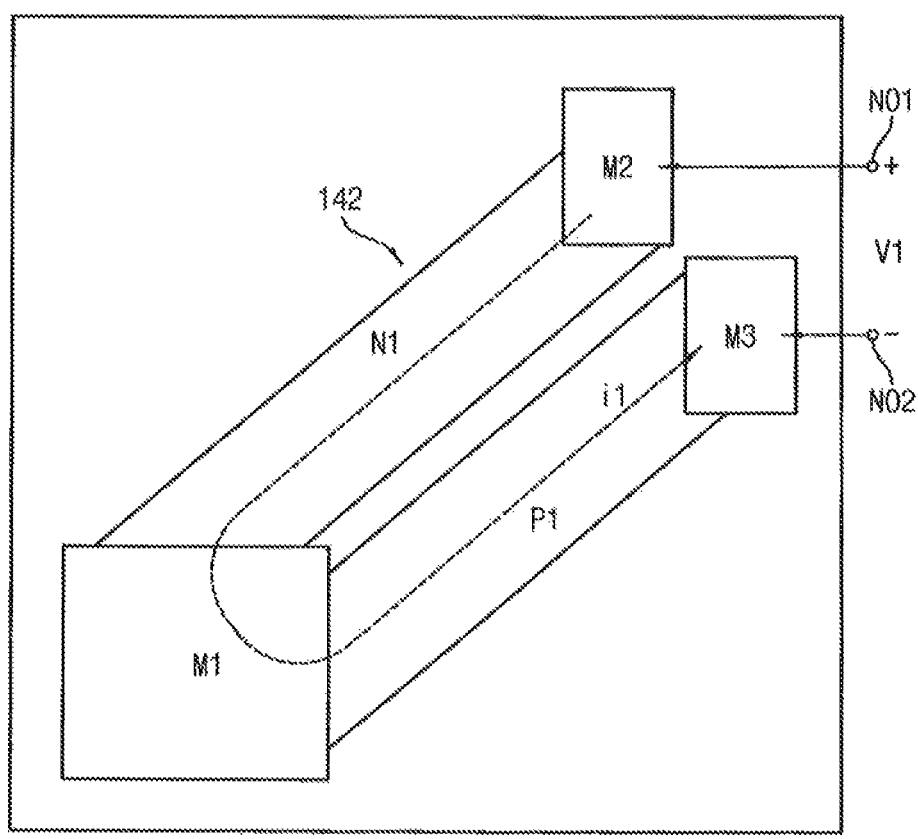
FIGS. 2, 3A, 3B and 4 illustrate an operation of the semiconductor chip of FIGS. 1A and 1B.
Figure 3A:
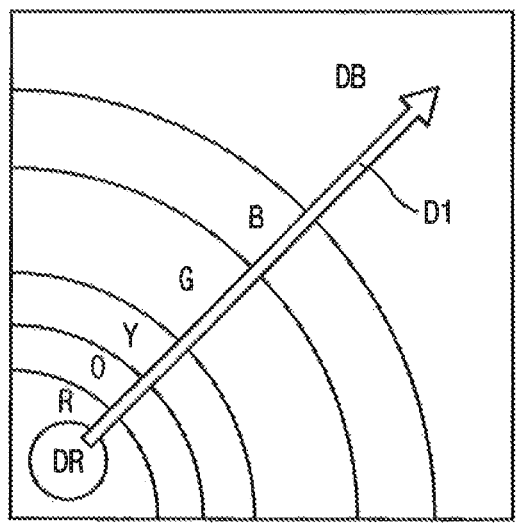
Figure 3B:
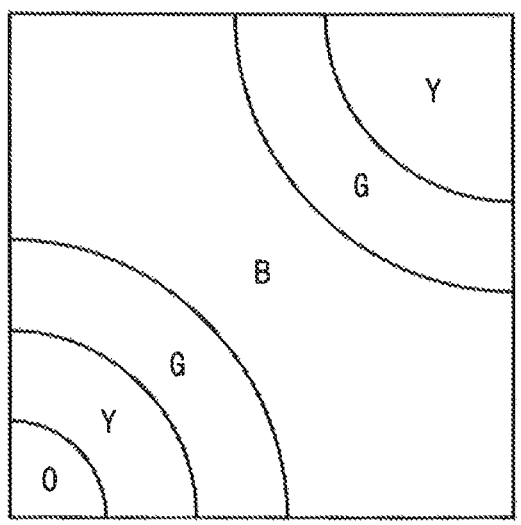
Figure 4:
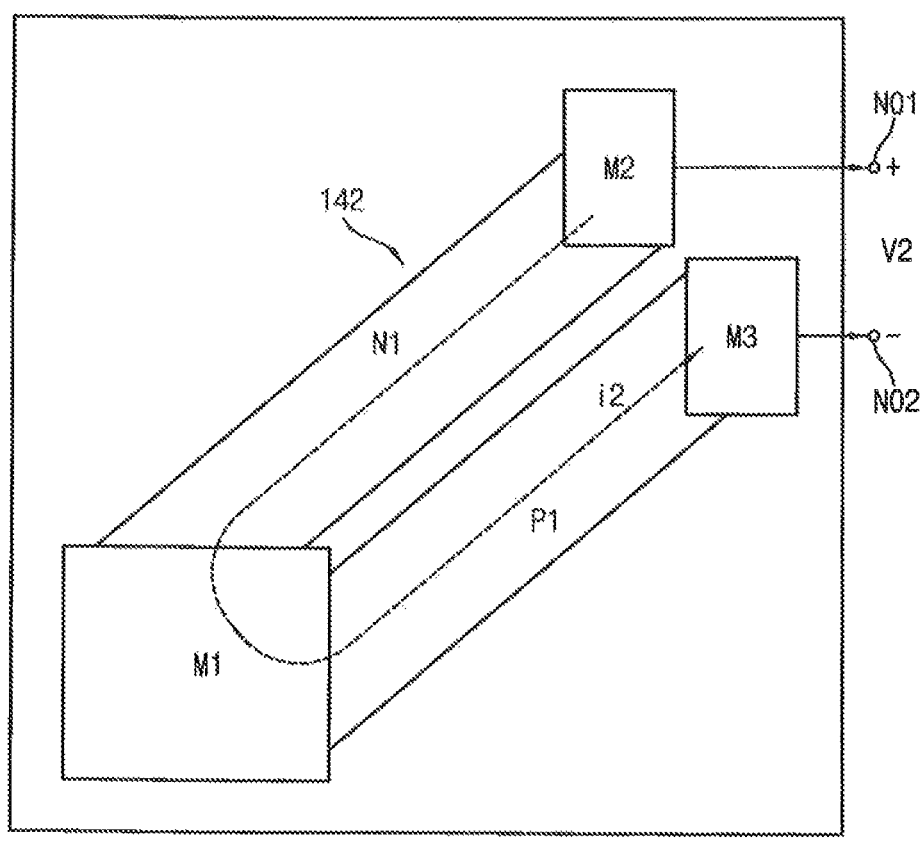

FIGS. 2, 3A, 3B and 4 illustrate an operation of the semiconductor chip of FIGS. 1A and 1B. FIG. 2 is a plan view of the horizontal heat distributing operation of the semiconductor chip. FIGS. 3A and 3B are plan views of the change in temperature of the semiconductor chip due to the horizontal heat distributing operation. FIG. 4 is a plan view of the energy generating operation of the semiconductor chip. In FIGS. 3A and 3B, "DR" represents dark red, "R" represents red, "O" represents orange, "Y" represents yellow, "G" represents green, "B" represents blue, and "DB" represents dark blue. A red area may have a relatively high temperature, and a blue area may have a relatively low temperature. An area with a color closer to red may have a temperature higher than a temperature of an area with a color closer to blue.

Referring to FIG. 2, to perform a horizontal heat distributing operation, a first voltage V1 may be provided to the at least one first on-die thermoelectric element 142. For example, electric potentials may be provided to the second electrode M2 and the third electrode M3 through a first node NO1 and a second node NO2. During performance of the horizontal heat distributing operation, the first voltage V1 may correspond to a potential difference between the first node NO1 and the second node NO2.

A current i1 may be induced by the first voltage V1. For example, in the first semiconductor region N1, electrons of electron-hole pairs may more in a direction from the first electrode M1 to the second electrode M2 due to the first voltage V1. In the second semiconductor region P1, holes of electron-hole pairs may move in a direction from the first electrode M1 to the third electrode M3 due to the first voltage V1. The current i1 may flow through the at least one first on-die thermoelectric element 142 due to the movement of the electrons and the holes. A thermoelectric effect may be caused by the current i1, and heat may be horizontally distributed by converting electric energy into thermal energy. For example, heat generated at an area near the first electrode M1, such as the first area A1 in FIG. 1B, may be absorbed by the at least one first on-die thermoelectric element 142. Heat may be emitted into an area near the second and third electrodes M2 and M3, such as the second area A2 in FIG. 1B, through the at least one first on-die thermoelectric element 142.

Referring to FIG. 3A, before performing the horizontal heat distributing operation, a first area, such as a bottom left-corner area, of the semiconductor chip may have a relatively high temperature and the second area, such as a top right-corner area, of the semiconductor chip may have a relatively low temperature. In other words, the first area of the semiconductor chip may include a hot spot, and there may be a relatively large temperature difference between the first area and the second area. During performance of a horizontal heat distributing operation, heat generated by the first area may be transferred from the first area in a first direction D1 to the second area.

Referring to FIG. 3B, after performing a horizontal heat distributing operation, there may be a relatively small temperature difference between the first area of the semiconductor chip and the second area of the semiconductor chip. In other words, the temperature of the first area in FIG. 3B may lower than the temperature of the first area in FIG. 3A, and the temperature of the second area in FIG. 3B may be higher than the temperature of the second area in FIG. 3A. Since a horizontal heat distributing operation transfers heat from the first area to the second area within the semiconductor chip, a total average temperature of the semiconductor chip in FIG. 3B, i.e., after the horizontal heat distributing operation has been performed, may be substantially the same as a total average temperature of the semiconductor chip in FIG. 3A, i.e., before the horizontal heat distributing operation was performed.

A semiconductor chip 100 according to exemplary embodiments includes the at least one first on-die thermoelectric element 142. The at least one first on-die thermoelectric element 142 is disposed on the first circuit layer 120 of the semiconductor chip 100 and performs a horizontal heat distributing operation for the first circuit layer 120. Thus, the temperature of the first area A1 of the first circuit layer 120 corresponding to the hot spot may be effectively reduced although the total average temperature of the semiconductor chip 100 is not changed. A local temperature in the semiconductor chip 100, such as the temperature of the first area A1, should not exceed a critical temperature of the semiconductor chip 100, which is a temperature above which the performance of the semiconductor chip 100 may degrade. Since a hot spot can be recognized by an engineer while designing and/or verifying a semiconductor chip 100, thermal management may be effectively performed for the semiconductor chip 100 by manufacturing the semiconductor chip 100 with the at least one first on-die thermoelectric element 142.

Referring to FIG. 4, a thermoelectric effect may be caused by heat generated in an area near the first electrode M1, such the first area A1 in FIG. 1B, and an energy generating operation may convert thermal energy into electric energy. For example, in the first semiconductor region N1, electrons may move from the first electrode M1 to the second electrode M2 based on a temperature difference between the area near the first electrode M1 and the area near the second electrode M2, such as the second area A2 in FIG. 1B. In the second semiconductor region P1, holes may move from the first electrode M1 to the third electrode M3 based on a temperature difference between the area near the first electrode M1 and the area near the third electrode M3, such as the second area A2 in FIG. 1B. A current i2 may flow through the at least one first on-die thermoelectric element 142 due to the movement of the electrons and the holes. A second voltage V2 may be induced by the current i2. During performance of the energy generating operation, the second voltage V2 may correspond to a potential difference between the first node NO1 and the second node NO2. As will be described with reference to FIG. 6, power may be collected based on the second voltage V2. The collected power may be used to operate the plurality of active elements AE and the plurality of passive elements PE included in the first circuit layer 120, or to recharge an external battery.

In the semiconductor chip 100 according to exemplary embodiments, the at least one first on-die thermoelectric element 142 may further perform an energy generating operation. Thus, the semiconductor chip 100 may have an improved energy efficiency.

Figure 5:
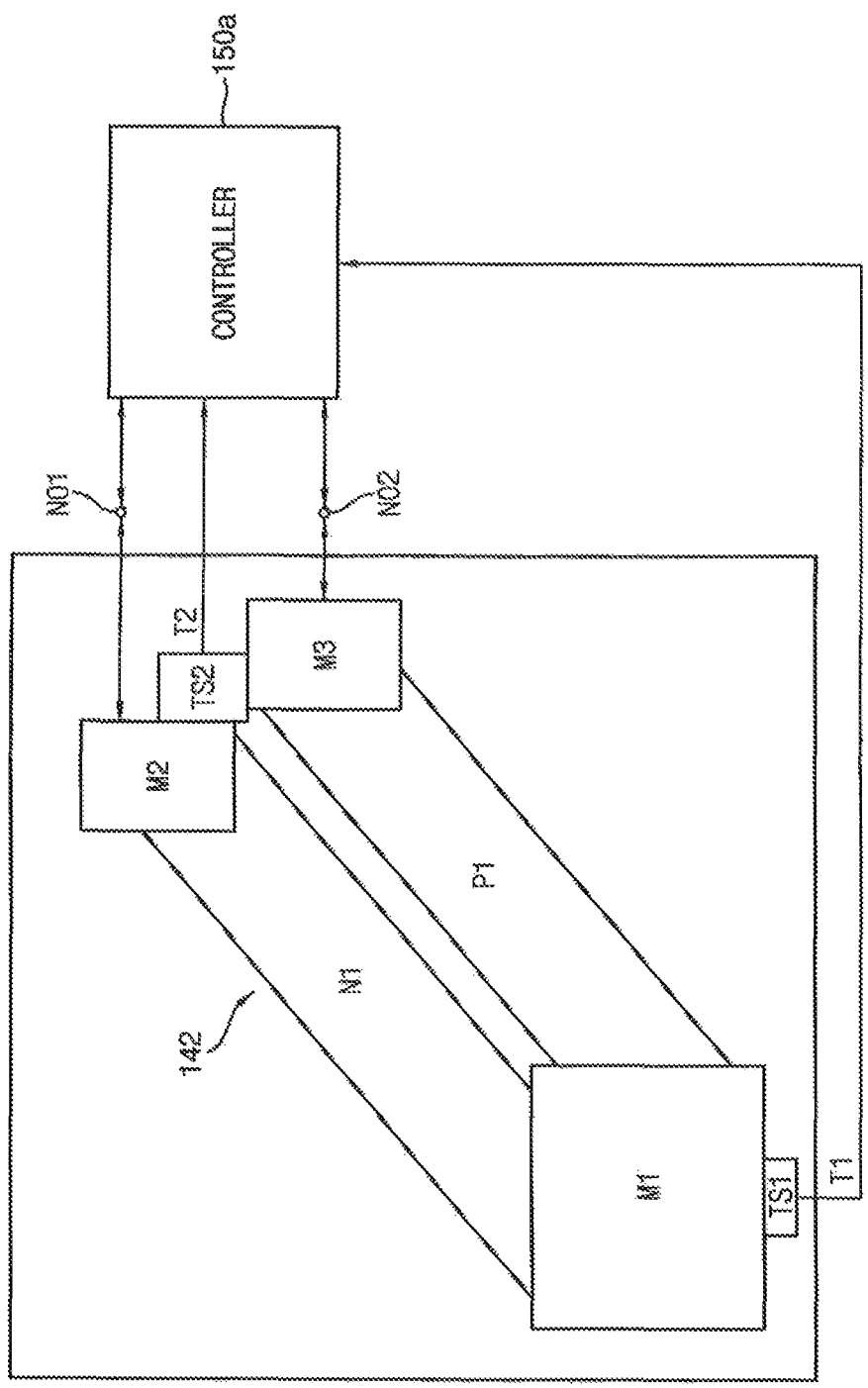
FIG. 5 illustrates an example of the semiconductor chip of FIGS. 1A and 1B.

FIG. 5 illustrates an example of the semiconductor Chip of FIGS. 1A and 1B.

Referring to FIG. 5, a semiconductor chip 100a includes at least one first on-die thermoelectric element 142. The semiconductor chip 100a may further include a controller 150a.

As described above with reference to FIGS. 1A and 1B, the semiconductor chip 100a includes a first circuit layer 120 and a first thermoelectric layer 140 disposed on one surface of the first circuit layer 120. The at least one first on-die thermoelectric element 142 is disposed in the first thermoelectric layer 140.

The at least one first on-die thermoelectric element 142 may perform a horizontal heat distributing operation during a first operation mode and may perform an energy generating operation during a second operation mode. For example, the first operation mode may be enabled when a first temperature T1 at the first area A1 of the first circuit layer 120 is higher than a reference temperature, such as a critical temperature. The second operation mode may be enabled when the first operation mode is disabled, such as when the first temperature T1 at the first area A1 is equal to or less than the reference temperature. The semiconductor chip 100a may further include a first temperature sensor TS1 that measures a first temperature T1 at the first area A1 and a second temperature sensor TS2 that measures a second temperature T2 at the second area A2. The reference temperature may change according to exemplary embodiments.

The controller 150a may control an operation mode of the semiconductor chip 100a. For example, the controller 150a may provide a first voltage to the at least one first on-die thermoelectric element 142 through first and second nodes NO1 and NO2. The at least one first on-die thermoelectric element 142 may perform a horizontal heat distributing operation based on the first voltage. The controller 150a may collect the power generated by an energy generating operation through the first and second nodes NO1 and NO2.

Figure 6:
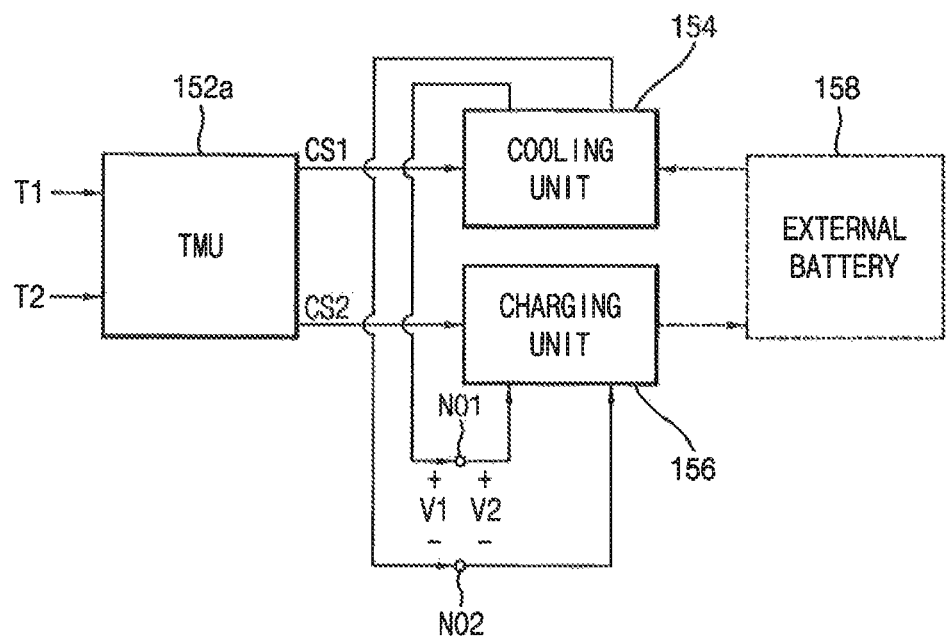
FIG. 6 is a block diagram of an example of a controller included in the semiconductor chip of FIG. 5.

FIG. 6 is a block diagram of an example of a controller included in the semiconductor chip of FIG. 5.

Referring to FIG. 6, the controller 150a may include a thermal management unit 152a, a cooling unit 154 and a charging unit 156.

The thermal management unit 152a may generate a first control signal CS1 and a second control signal CS2 based on the first temperature T1 and the second temperature T2. The first temperature T1 may be a temperature at the first area A1 of the first circuit layer 120 that is measured by the first temperature sensor TS1 in FIG. 5. The second temperature T2 may be a temperature at the second area A2 of the first circuit layer 120 that is measured by the second temperature sensor TS2 in FIG. 5.

The cooling unit 154 may provide the first voltage V1 to the at least one first on-die thermoelectric element 142 based on the first control signal CS1. For example, the first voltage V1 may be received from an external battery 158 and may be provided to the second and third electrodes M2 and M3 of the at least one first on-die thermoelectric element 142 through the first and second nodes NO1 and NO2.

The charging unit 156 may collect the power generated by the energy generating operation based on the second control signal CS2. For example, the charging unit 156 may receive the second voltage V2, which corresponds to the power, through the first and second nodes NO1 and NO2. The external battery 158 may be recharged based on the second voltage V2. In addition, the charging unit 156 may directly provide the second voltage V2 to the plurality of active elements AE and the plurality of passive elements PE included in the first circuit layer 120.

Figure 7:
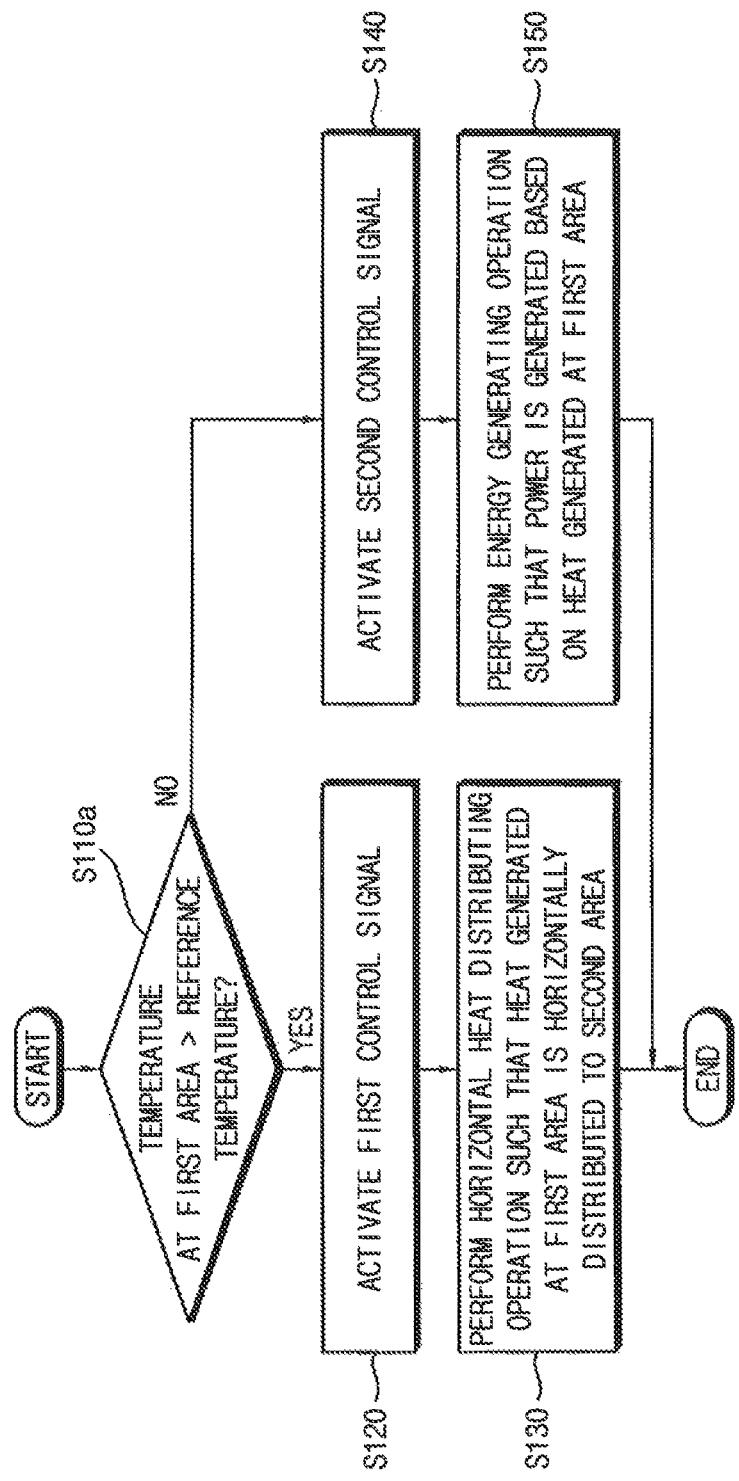
FIG. 7 is a flow chart of an operation of the controller of FIG. 6.

FIG. 7 is a flow chart of an operation of the controller of FIG. 6.

Referring to FIGS. 6 and 7, the thermal management unit 152a may compare the first temperature T1 at the first area A1 with the reference temperature (step S110a). If the first temperature T1 is greater than the reference temperature (step S110a: YES), the thermal management unit 152a may activate the first control signal CS1 (step S120). The cooling unit 154 may be enabled based on the activated first control signal CS1, and the semiconductor chip 100a may operate in the first operation mode. For example, the at least one first on-die thermoelectric element 142 may perform the horizontal heat distributing operation to horizontally distribute heat generated at the first area A1 to the second area A2 (step S130). The horizontal heat distributing operation may be substantially similar to an example such as those described above with reference to FIGS. 2, 3A and 3B.

When the first temperature T1 is equal to or less than the reference temperature (step S110a: NO), the thermal management unit 152a may activate the second control signal CS2 (step S140). The charging unit 156 may be enabled based on the activated second control signal CS2, and the semiconductor chip 100a may operate in the second operation mode. For example, the at least one first on-die thermoelectric element 142 may perform the energy generating operation to generate power from the heat generated at the first area A1 (step S150). The energy generating operation may be substantially similar to an example such as that described above with reference to FIG. 4.

Figure 8:
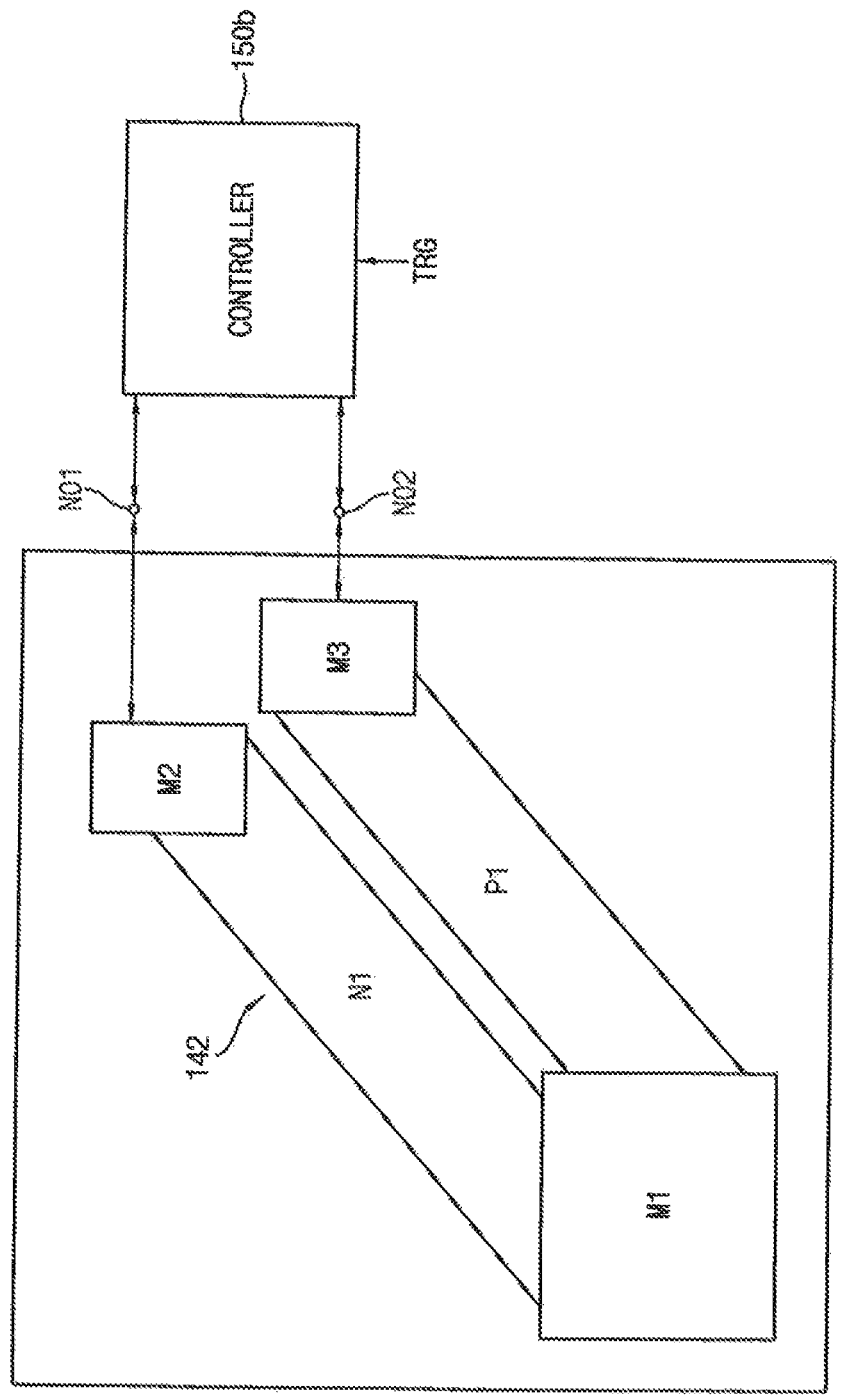
FIG. 8 illustrates another example of the semiconductor chip of FIGS. 1A and 1B.

FIG. 8 illustrates another example of the semiconductor chip of FIGS. 1A and 1B.

Referring to FIG. 8, a semiconductor chip 100b includes at least one first on-die thermoelectric element 142. The semiconductor chip 100a may further include a controller 150b.

As described above with reference to FIGS. 1A and 1B, the semiconductor chip 100b includes a first circuit layer 120 and a first thermoelectric layer 140 disposed on one surface of the first circuit layer 120. The at least one first on-die thermoelectric element 142 is disposed in the first thermoelectric layer 140.

The at least one first on-die thermoelectric element 142 may perform horizontal heat distributing operation during a first operation mode and may perform an energy generating operation during a second operation mode. For example, the first operation mode may be enabled when a trigger signal TRG is activated. The second operation mode may be enabled when the first operation mode is disabled, such as when the trigger signal TRG is deactivated. The trigger signal TRG gray be activated when the semiconductor chip 100b is expected to overheat, such as when a workload of the semiconductor chip 100b is greater than a reference workload.

The controller 150b may control an operation mode of the semiconductor chip 100b. For example, the controller 150b may provide a first voltage to the at least one first on-die thermoelectric element 142 through first and second nodes NO1 and NO2. The at least one first on-die thermoelectric element 142 may perform a horizontal heat distributing operation based on the first voltage. The controller 150b may collect the power generated by an energy generating operation through the first and second nodes NO1 and NO2.

Figure 9:
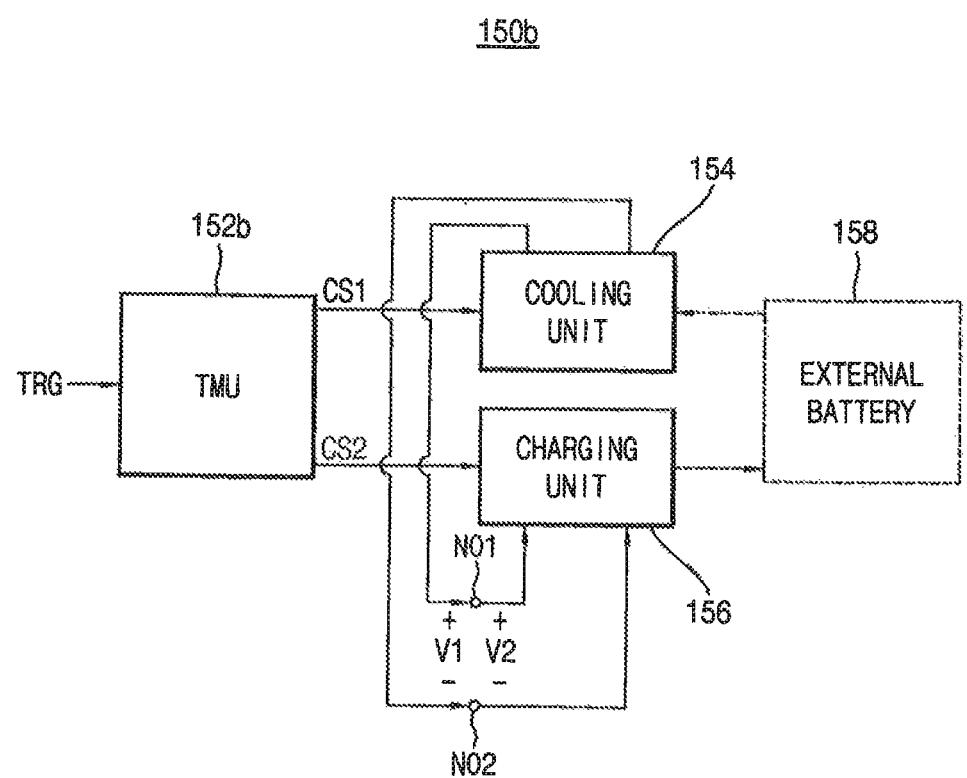
FIG. 9 is a block diagram of an example of a controller included in the semiconductor chip of FIG. 8.

FIG. 9 is a block diagram of an example of a controller included in the semiconductor chip of FIG. 8.

Referring to FIG. 9, the controller 150b may include a thermal management unit 152b, a cooling unit 154 and a charging unit 156.

The thermal management unit 152b may generate a first control signal CS1 and a second control signal CS2 based on the trigger signal TRG. The cooling unit 154 may provide the first voltage V1 to the at least one first on-die thermoelectric element 142 based on the first control signal CS1. For example, the first voltage V1 may be received from an external battery 158 and may be provided to the second and third electrodes M2 and M3 of the at least one first on-die thermoelectric element 142 through the first and second nodes NO1 and NO2. The charging unit 156 may collect the power generated by an energy generating operation based on the second control signal CS2. For example, the charging unit 156 may receive the second voltage V2, which corresponds to the power, through the first and second nodes NO1 and NO2. The external battery 158 may be recharged based on the second voltage V2. The cooling unit 154 and the charging unit 156 in FIG. 9 may be substantially the same as the cooling unit 154 and the charging unit 156 in FIG. 6, respectively.

Figure 10:
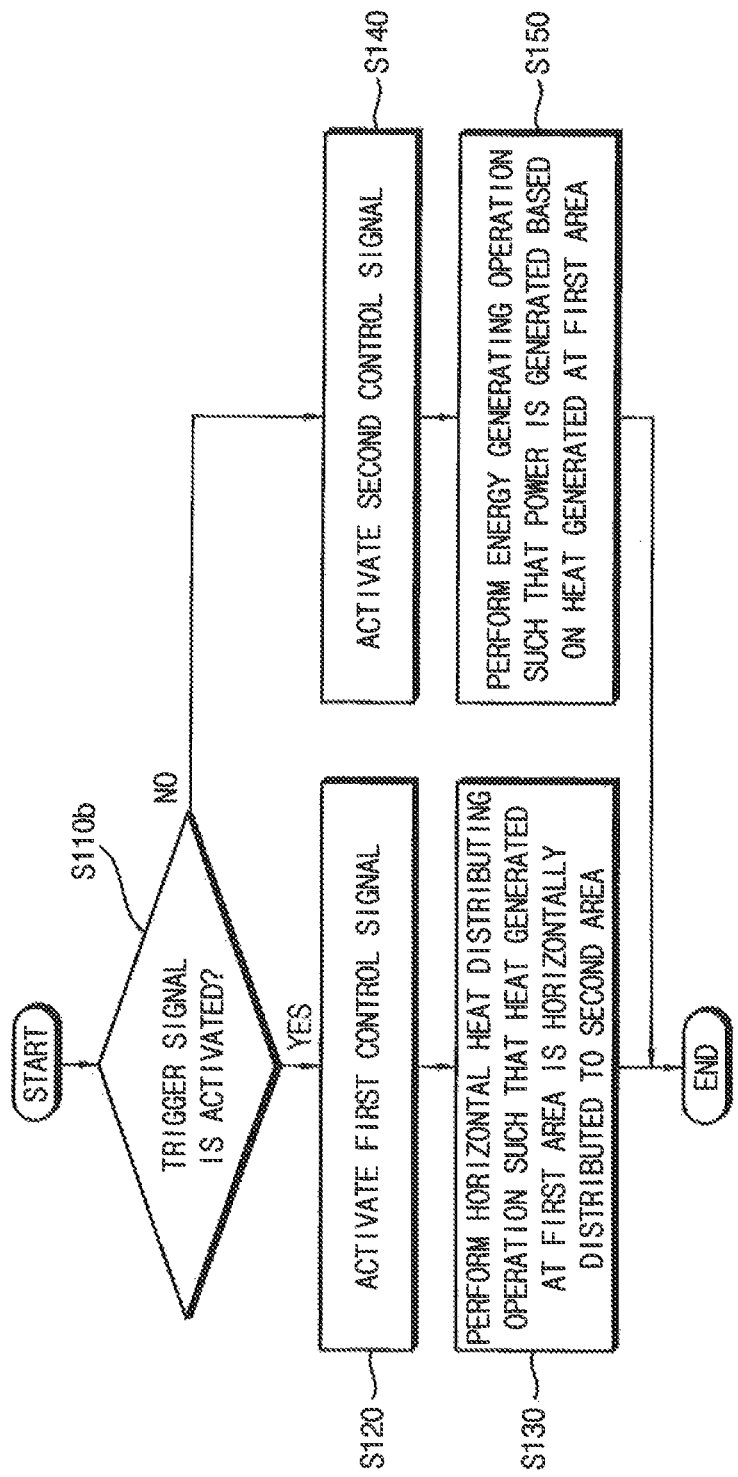
FIG. 10 is a flow chart of an operation of the controller of FIG. 9.

FIG. 10 is a flow chart of an operation of the controller of FIG. 9.

Referring to FIGS. 9 and 10, the thermal management unit 152b may determine whether the trigger signal TRG is activated (step S110b). If the trigger signal TRG is activated (step S110b: YES), the thermal management unit 152b may activate the first control signal CS1 (step S120). The cooling unit 154 may be enabled based on the activated first control signal CS1, and the at least one first on-die thermoelectric element 142 may perform a horizontal heat distributing operation to horizontally distribute heat generated at the first area A1 to the second area A2 (step S130). When the trigger signal TRG is deactivated (step S110b: NO), the thermal management unit 152b may activate the second control signal CS2 (step S140). The charging unit 156 may be enabled based on the activated second control signal CS2, and the at least one first on-die thermoelectric element 142 may perform an energy generating operation to generate power from the heat generated at the first area A1 (step S150). The steps S120, S130, S140 and S150 in FIG. 10 may be substantially the same as the steps S120, S130, S140 and S150 in FIG. 7, respectively.

According to exemplary embodiments, an operation mode of a semiconductor chip may change based on a combination of examples described above with reference to FIGS. 5 and 8. For example, a first operation mode may be enabled when the first temperature T1 at the first area A1 is higher than a reference temperature, as in an example of FIG. 5, or when a workload of the semiconductor chip is greater than a reference workload, as in an example of FIG. 8. A second operation mode may be enabled when the first operation mode is disabled. According to exemplary embodiments, there may be various criteria for changing the operation mode of the semiconductor chip.

In addition, the controllers 150a and 150b may be formed in the first circuit layer 120 or in the first thermoelectric layer 140.

In the semiconductor chips 100a and 100b according to exemplary embodiments, a horizontal heat distributing operation and an energy generating operation may be selectively and alternately performed as controlled by the controllers 150a and 150b, respectively. For example, the semiconductor chips 100a and 100b may perform a horizontal heat distributing operation only when needed to reduce the first temperature T1 at the first area A1. In other cases, such as when there is no need to reduce the first temperature T1 at the first area A1, the semiconductor chips 100a and 100b may perform an energy generating operation to collect power. Thus, thermal management for the semiconductor chips 100a and 100b may be effectively performed without an excessive waste of energy, and semiconductor chips 100a and 100b may be used in any mobile device or system.

Figure 11:
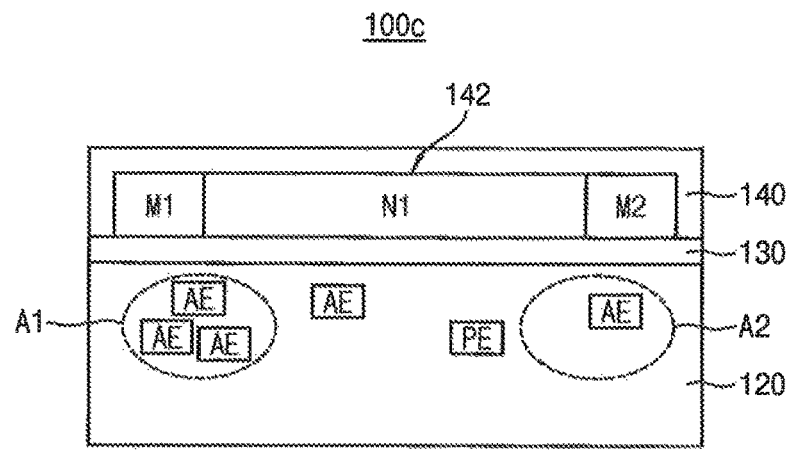
FIG. 11 is a cross-sectional view of a semiconductor chip according to exemplary embodiments.

FIG. 11 is a cross-sectional view of a semiconductor chip according to exemplary embodiments.

Referring to FIG. 11, a semiconductor chip 100c includes a first circuit layer 120 and a first thermoelectric layer 140. The semiconductor chip 100c may further include a first dielectric layer 130.

The first circuit layer 120 includes a plurality of active elements AE and a plurality of passive elements PE. The first thermoelectric layer 140 is disposed on one surface of the first circuit layer 120 and includes at least one first on-die thermoelectric element 142 that is integrated within the semiconductor chip 100c. The first circuit layer 120, the first thermoelectric layer 140 and the at least one first on-die thermoelectric element 142 in FIG. 11 may be substantially the same as the first circuit layer 120, the first thermoelectric layer 140 and the at least one first on-die thermoelectric element 142 in FIGS. 1A and 1B, respectively.

The first dielectric layer 130 may be disposed between the first circuit layer 120 and the first thermoelectric layer 140. The first circuit layer 120 may be electrically insulated from the first thermoelectric layer 140 by the first dielectric layer 130. For example, the first dielectric layer 130 may be formed from at least one dielectric material, such as silicon oxide (SiOx), silicon oxynitride (SiOxNy), silicon nitride (SiNx), germanium oxynitride (GeOxNy), germanium silicon oxide (GeSixOy), and/or a material having a high dielectric constant, such as hafnium oxide (HfOx), zirconium oxide (ZrOx), aluminum oxide (AlOx), tantalum oxide (TaOx), hafnium silicate (HfSix), and/or zirconium silicate (ZrSix). For example, the first dielectric layer 130 may have multiple layers which include different dielectric materials.

Figure 12:
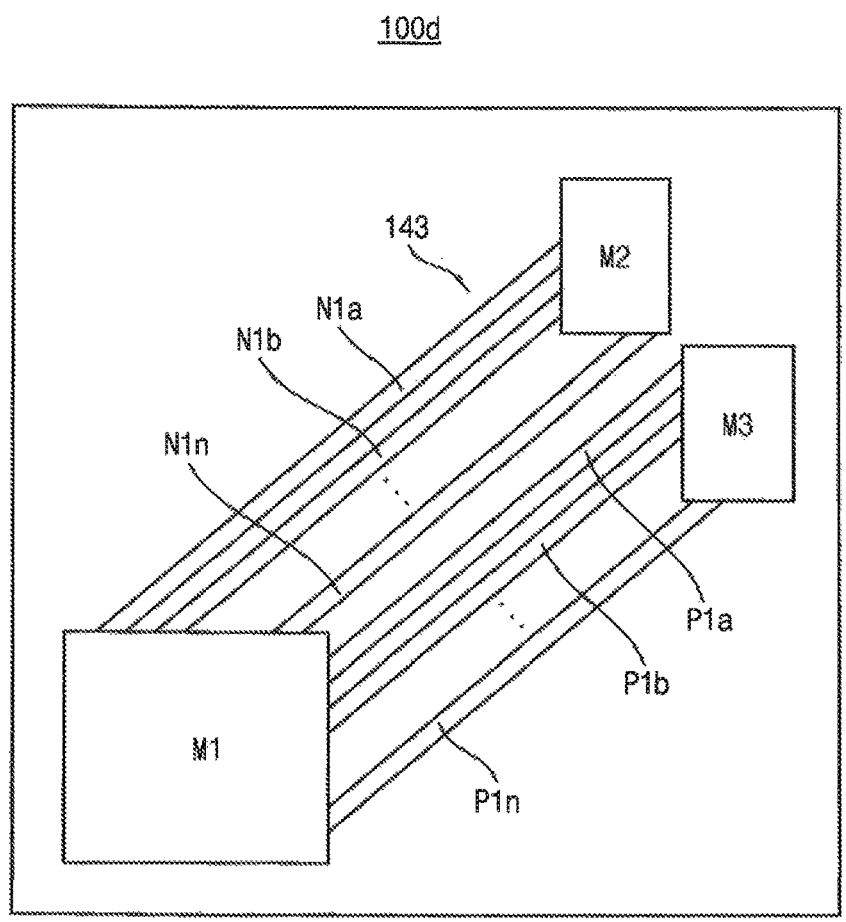
FIG. 12 is a plan view of a semiconductor chip according to exemplary embodiments.

FIG. 12 is a plan view of a semiconductor chip according to exemplary embodiments.

Referring to FIG. 12, a semiconductor chip 100d includes at least one first on-die thermoelectric element 143.

As described above with reference to FIGS. 1A and 1B, the semiconductor chip 100d includes a first circuit layer 120 and a first thermoelectric layer 140 disposed on one surface of the first circuit layer 120. The at least one first on-die thermoelectric element 143 is disposed in the first thermoelectric layer 140.

The at least one first on-die thermoelectric element 143 may perform a horizontal heat distributing operation during a first operation mode and may perform an energy generating operation during a second operation mode. The at least one first on-die thermoelectric element 143 may include a first electrode M1, a second electrode M2, a third electrode M3, a plurality of first semiconductor regions N1a, N1b, . . . , N1n and a plurality of second semiconductor regions P1a, P1b, . . . , P1n. The first electrode M1 may be disposed in the first thermoelectric layer 140 and may correspond to the first area A1 of the first circuit layer 120. The second electrode M2 and the third electrode M3 may be disposed in the first thermoelectric layer 140 and may correspond to the second area A2 of the first circuit layer 120. The third electrode M3 may be spaced apart from the second electrode M2. Each of the first semiconductor regions N1a, . . . , N1n may be disposed between the first electrode M1 and the second electrode M2 to connect the first electrode M1 with the second electrode M2. Each of the second semiconductor regions P1a, . . . , P1n may be disposed between the first electrode M1 and the third electrode M3 to connect the first electrode M1 with the third electrode M3. The first, second and third electrodes M1, M2 and M3 may include a metal. The first semiconductor regions N1a, . . . , N1n may include an n-type semiconductor. The second semiconductor regions P1a, . . . , P1n may include a p-type semiconductor.

As illustrated in FIG. 12, the horizontal heat distributing operation and the energy generating operation of a semiconductor chip 100d may have improved performance when the first semiconductor regions N1a, . . . , N1n are disposed between the first electrode M1 and the second electrode M2, and the second semiconductor regions P1a, . . . , P1n are disposed between the first electrode M1 acid the third electrode M3.

Figure 13:
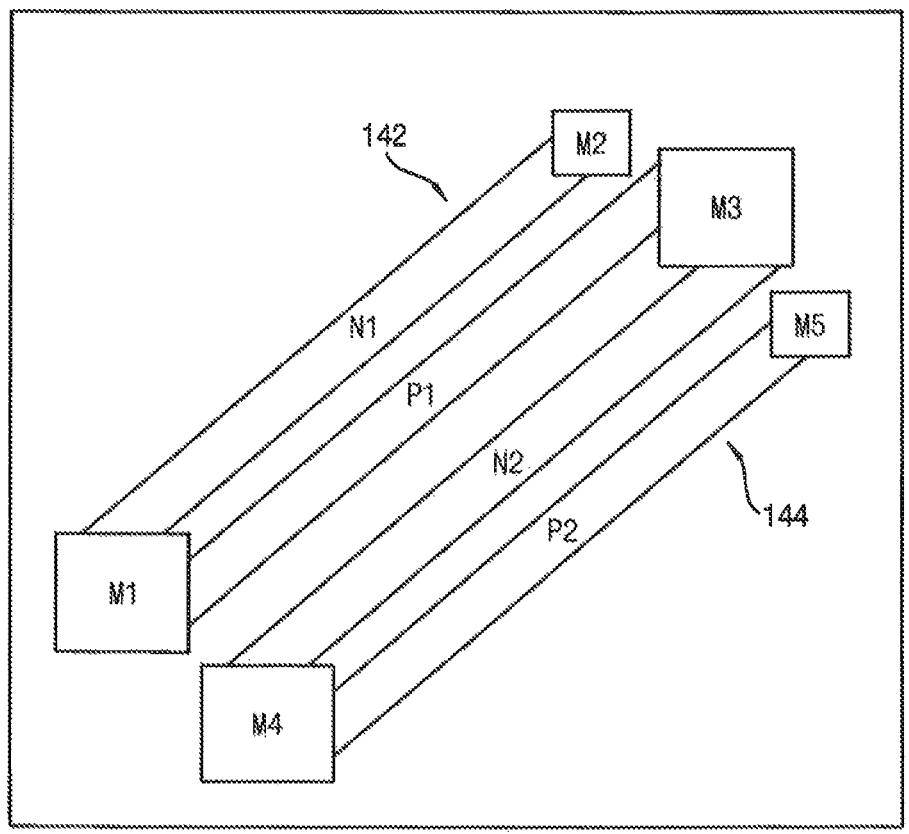
FIG. 13 is a plan view of a semiconductor chip according to exemplary embodiments.

FIG. 13 is a plan view of a semiconductor chip according to exemplary embodiments.

Referring to FIG. 13, a semiconductor chip 100e includes first on-die thermoelectric elements 142 and 144.

As described above with reference to FIGS. 1A and 1B, the semiconductor chip 100e includes a first circuit layer 120 and a first thermoelectric layer 140 disposed on one surface of the first circuit layer 120. The first on-die thermoelectric elements 142 and 144 are disposed in the first thermoelectric layer 140.

The first on-die thermoelectric elements 142 and 144 may perform a horizontal heat distributing operation during a first operation mode and may perform an energy generating operation during a second operation mode. The first on-die thermoelectric elements 142 and 144 may be connected in serial. The on-die thermoelectric element 142 may include a first electrode M1, a second electrode M2, a third electrode M3, a first semiconductor region N1 and a second semiconductor region P1. The on-die thermoelectric element 142 in FIG. 13 may be substantially the same as the on-die thermoelectric element 142 in FIG. 1A. The on-die thermoelectric element 144 may include the third electrode M3, a fourth electrode M4, a fifth electrode M5, a third semiconductor region N2 and a fourth semiconductor region P2. The fourth electrode M4 may be disposed in the first thermoelectric layer 140 and may correspond to the first area A1 of the first circuit layer 120. The third electrode M3 and the fifth electrode M5 may be disposed in the first thermoelectric layer 140 and may correspond to the second area A2 of the first circuit layer 120. The fifth electrode M5 may be spaced apart from the third electrode M3. The third semiconductor region N2 may be disposed between the third electrode M3 and the fourth electrode M4 to connect the third electrode M3 with the fourth electrode M4. The fourth semiconductor region P2 may be disposed between the fourth electrode M4 and the fifth electrode M5 to connect the fourth electrode M4 with the fifth electrode M5. The third, fourth and fifth electrodes M3, M4 and M5 may include a metal. The third semiconductor region N2 may include an n-type semiconductor. The fourth semiconductor region P2 may include a p-type semiconductor.

As illustrated in FIG. 13, the horizontal heat distributing operation and the energy generating operation of a semiconductor chip 100e may have improved performance when the first on-die thermoelectric elements 142 and 144 are connected in serial.

According to exemplary embodiments, the on-die thermoelectric elements may be implemented by a combination of examples as described above with reference to FIGS. 12 and 13. For example, a semiconductor chip may include a plurality of on-die thermoelectric elements connected in serial and a plurality of semiconductor regions may be disposed between two electrodes of each of the plurality of on-die thermoelectric elements.

Figure 14A:
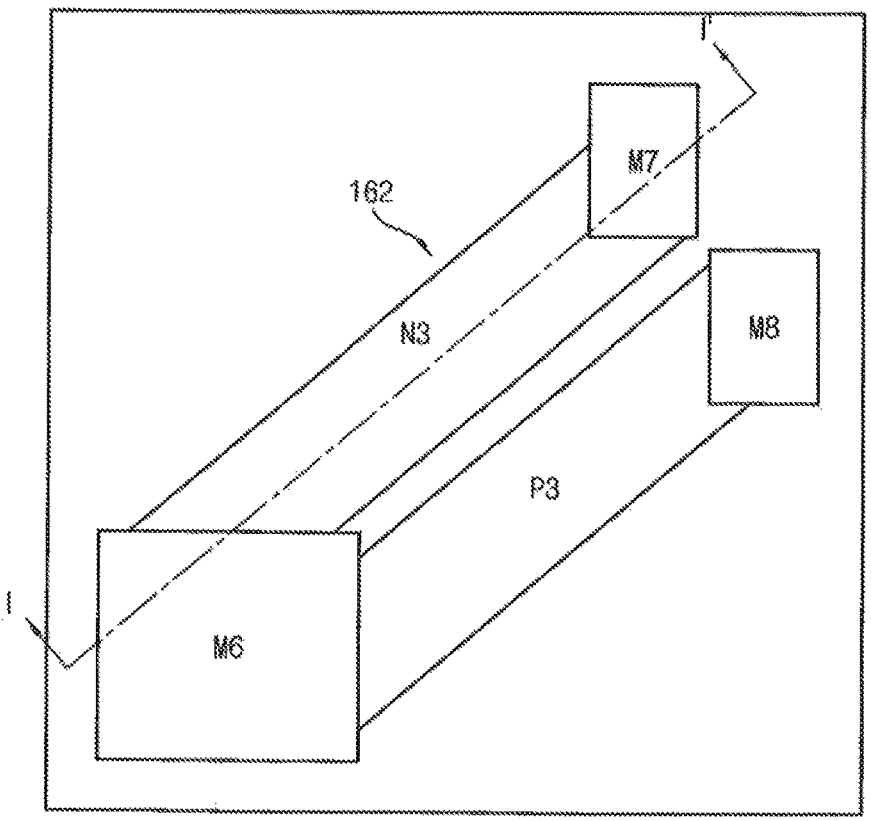
FIGS. 14A and 14B illustrate a semiconductor chip according to exemplary embodiments.
Figure 14B:
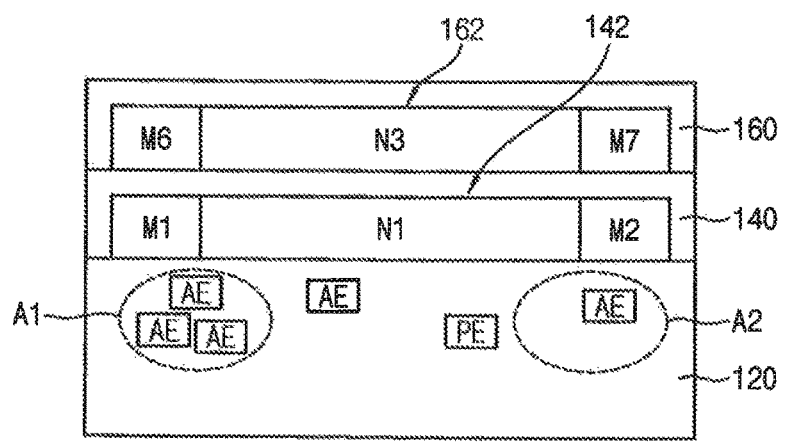

FIGS. 14A and 14B are diagrams of a semiconductor chip according to exemplary embodiments. FIG. 14A is a plan view of the semiconductor chip. FIG. 14B is a cross-sectional view of the semiconductor chip taken along a line I-I' of FIG. 14A.

Referring to FIGS. 14A and 14B, a semiconductor chip 100f includes a first circuit layer 120 and a first thermoelectric layer 140. The semiconductor chip 100f may further include a second thermoelectric layer 160.

The first circuit layer 120 includes a plurality of active elements AE and a plurality of passive elements PE. The first thermoelectric layer 140 is disposed on one surface of the first circuit layer 120 and includes at least one first on-die thermoelectric element 142 integrated within the semiconductor chip 100f. The first circuit layer 120, the first thermoelectric layer 140 and the at least one first on-die thermoelectric element 142 in FIGS. 14A and 14B may be substantially the same as the first circuit layer 120, the first thermoelectric layer 140 and the at least one first on-die thermoelectric element 142 in FIGS. 1A and 1B, respectively.

The second thermoelectric layer 160 may be disposed on one surface of the first thermoelectric layer 140. The second thermoelectric layer 160 may include at least one second on-die thermoelectric element 162 integrated within the semiconductor chip 100f. Similar to the at least one first on-die thermoelectric element 142, the at least one second on-die thermoelectric element 162 may perform a horizontal heat distributing operation and an energy generating operation.

The at least one second on-die thermoelectric element 162 may include a fourth electrode M6, a fifth electrode M7, a sixth electrode M8, a third semiconductor region N3 and a fourth semiconductor region P3. The fourth electrode M6 may be disposed in the second thermoelectric layer 160 and may correspond to the first area A1 of the first circuit layer 120. The fifth electrode M7 and the sixth electrode M8 may be disposed in the second thermoelectric layer 160 and may correspond to the second area A2 of the first circuit layer 120. The sixth electrode M8 may be spaced apart from the fifth electrode M7. The third semiconductor region N3 may be disposed between the fourth electrode M6 and the fifth electrode M7 to connect the fourth electrode M6 with the fifth electrode M7. The fourth semiconductor region P3 may be disposed between the fourth electrode M6 and the sixth electrode M8 to connect the fourth electrode M6 with the sixth electrode M8. The fourth, fifth and sixth electrodes M6, M7 and M8 may include a metal. The third semiconductor region N3 may include an n-type semiconductor. The fourth semiconductor region P3 may include a p-type semiconductor.

According to exemplary embodiments, a semiconductor chip may include a plurality of stacked thermoelectric layers. According to exemplary embodiments, the on-die thermoelectric elements 142 and 162 may be implemented by an example as described above with reference to FIG. 12, an example as described above with reference to FIG. 13 or a combination of examples as described above with reference to FIGS. 12 and 13. According to exemplary embodiments, a semiconductor chip may further include a first dielectric layer disposed between the first circuit layer 120 and the first thermoelectric layer 140, and/or may further include a second dielectric layer disposed between the first thermoelectric layer 140 and the second thermoelectric layer 160.

FIG. 15 is a plan view of a semiconductor chip according to exemplary embodiments.

Referring to FIG. 15, a semiconductor chip 100g includes at least one first on-die thermoelectric element 146. The semiconductor chip 100g may further include at least one second on-die thermoelectric element 147.

As described above with reference to FIGS. 1A and 1B, the semiconductor chip 100g includes a first circuit layer 120 and a first thermoelectric layer 140 disposed on one surface of the first circuit layer 120. The at least one first on-die thermoelectric element 146 and the at least one second on-die thermoelectric element 147 are disposed in the first thermoelectric layer 140.

The at least one first on-die thermoelectric element 146 may be spaced apart from the at least one second on-die thermoelectric element 147. The at least one first on-die thermoelectric element 146 may perform a horizontal heat distributing operation. The at least one second on-die thermoelectric element 147 may perform an energy generating operation.

The at least one first on-die thermoelectric element 146 may include a first electrode MA, a second electrode MB, a third electrode MC, a first semiconductor region NA and a second semiconductor region PA. The first electrode MA may be disposed in the first thermoelectric layer 140 and may correspond to the first area A1 of the first circuit layer 120. The second electrode MB and the third electrode MC may be disposed in the first thermoelectric layer 140 and may correspond to the second area A2 of the first circuit layer 120. The third electrode MC may be spaced apart from the second electrode MB. The first semiconductor region NA may be disposed between the first electrode MA and the second electrode MB to connect the first electrode MA with the second electrode MB. The second semiconductor region PA may be disposed between the first electrode MA and the third electrode MC to connect the first electrode MA with the third electrode MC. The first, second and third electrodes MA, MB and MC may include a metal. The first semiconductor region NA may include an n-type semiconductor. The second semiconductor region PA may include a p-type semiconductor.

The at least one second on-die thermoelectric element 147 may include a fourth electrode MD, a fifth electrode ME, a sixth electrode MF, a third semiconductor region NB and a fourth semiconductor region PB. The fourth electrode MD may be disposed in the first thermoelectric layer 140 and may correspond to the first area A1 of the first circuit layer 120. The fifth electrode ME and the sixth electrode MF may be disposed in the first thermoelectric layer 140 and may correspond to the second area A2 of the first circuit layer 120. The sixth electrode MF may be spaced apart from the fifth electrode ME. The third semiconductor region NB may be disposed between the fourth electrode MD and the fifth electrode ME to connect the fourth electrode MD with the fifth electrode ME. The fourth semiconductor region PB may be disposed between the fourth electrode MD and the sixth electrode MF to connect the fourth electrode MD with the sixth electrode MF. The fourth, fifth and sixth electrodes MD, ME and MF may include a metal. The third semiconductor region NB may include an n-type semiconductor. The fourth semiconductor region PB may include a p-type semiconductor.

In an exemplary embodiment, the semiconductor chip 100g may further include a cooling unit 154 and a charging unit 156. The cooling unit 154 may provide a first voltage V1 to the at least one first on-die thermoelectric element 146. The at least one first on-die thermoelectric element 146 may perform a horizontal heat distributing operation based on the first voltage V1. The charging unit 156 may receive a second voltage V2 generated by the at least one second on-die thermoelectric element 147 to collect power generated by an energy generating operation. The cooling unit 154 and the charging unit 156 in FIG. 15 may be similar to the cooling unit 154 and the charging unit 156 in FIGS. 6 and 9, respectively. In addition, the first voltage V1 may be received from an external battery, such as the external battery 158 in FIGS. 6 and 9, and the external battery may be recharged based on the second voltage V2.

As illustrated in FIG. 15, a horizontal heat distributing operation and an energy generating operation of a semiconductor chip 100g may have improved performance when the at least one first on-die thermoelectric element 146 for a horizontal heat distributing operation and the at least one second on-die thermoelectric element 147 for an energy generating operation are separated.

According to exemplary embodiments, the on-die thermoelectric elements 146 and 147 may be implemented by an example as described above with reference to FIG. 12, an example as described above with reference to FIG. 13 or a combination of examples as described above with reference to FIGS. 12 and 13.

According to exemplary embodiments, a semiconductor chip may have a relatively complex structure. For example, a semiconductor chip according to exemplary embodiments may be one of an application processor (AP), a microprocessor or a central processing unit (CPU). Various electronic systems that include a semiconductor chip, such as a processor, a timing controller, an AP, etc., according to exemplary embodiments will be described below with reference to FIGS. 16 through 20.

Figure 16:
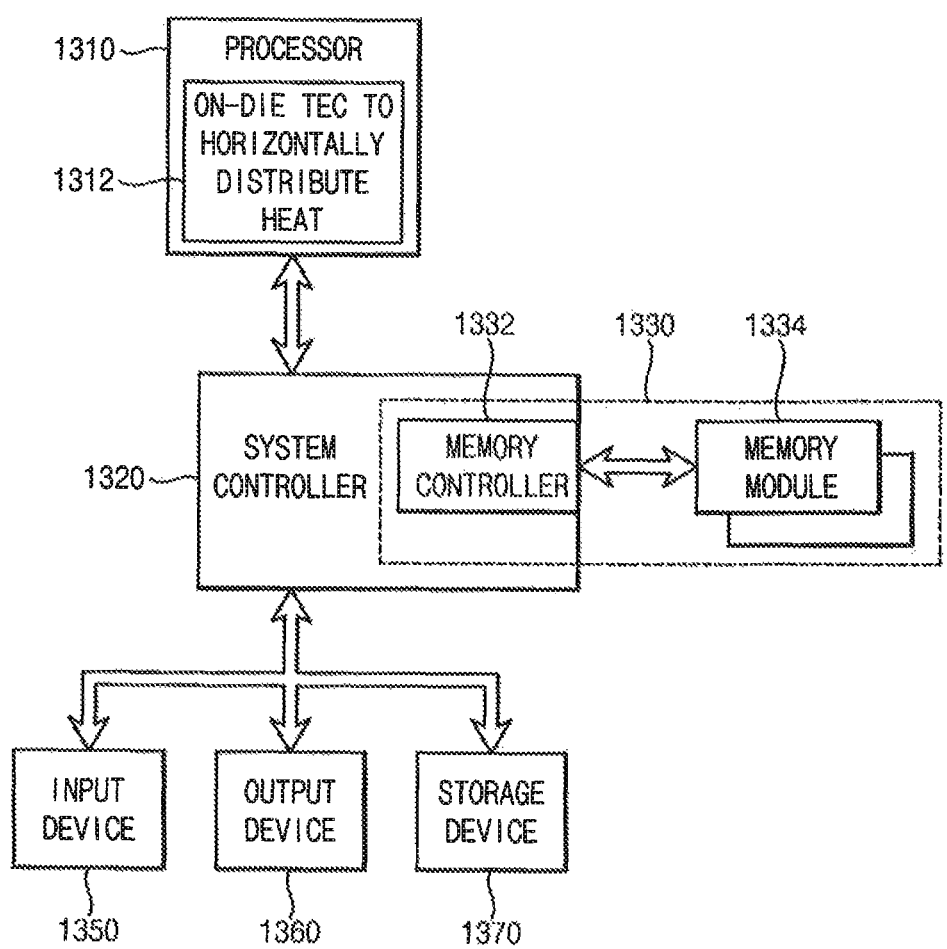
FIG. 16 is a block diagram of a memory system according to exemplary embodiments.

FIG. 16 is a block diagram of a memory system according to exemplary embodiments.

Referring to FIG. 16, a memory system 1300 includes a processor 1310, a system controller 1320 and a memory device 1330. The memory system 1300 may further include an input device 1350, an output device 1360 and a storage device 1370.

The memory device 1330 may include a plurality of memory modules 1334, and a memory controller 1332 for controlling the memory modules 1334. The memory modules 1334 may include at least one volatile memory, such as a dynamic random access memory (DRAM), a static random access memory (SRAM), and/or at least one nonvolatile memory, such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM). The memory controller 1332 may be included in the system controller 1320.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The processor 1310 may be implemented as a semiconductor chip according to exemplary embodiments. For example, the processor 1310 may include an on-die thermoelectric element 1312 which may be implemented by examples such as those described above with reference to FIGS. 1A, 1B, 5, 8, 11, 12, 13, 14A, 14B and 15. The on-die thermoelectric element 1312 integrated within the processor chip may selectively perform a horizontal heat distributing operation and an energy generating operation. Accordingly, hot spots in the processor chip may be effectively eliminated without increasing a thickness of the processor chip, and the processor chip may have ala improved energy efficiency.

Figure 17:
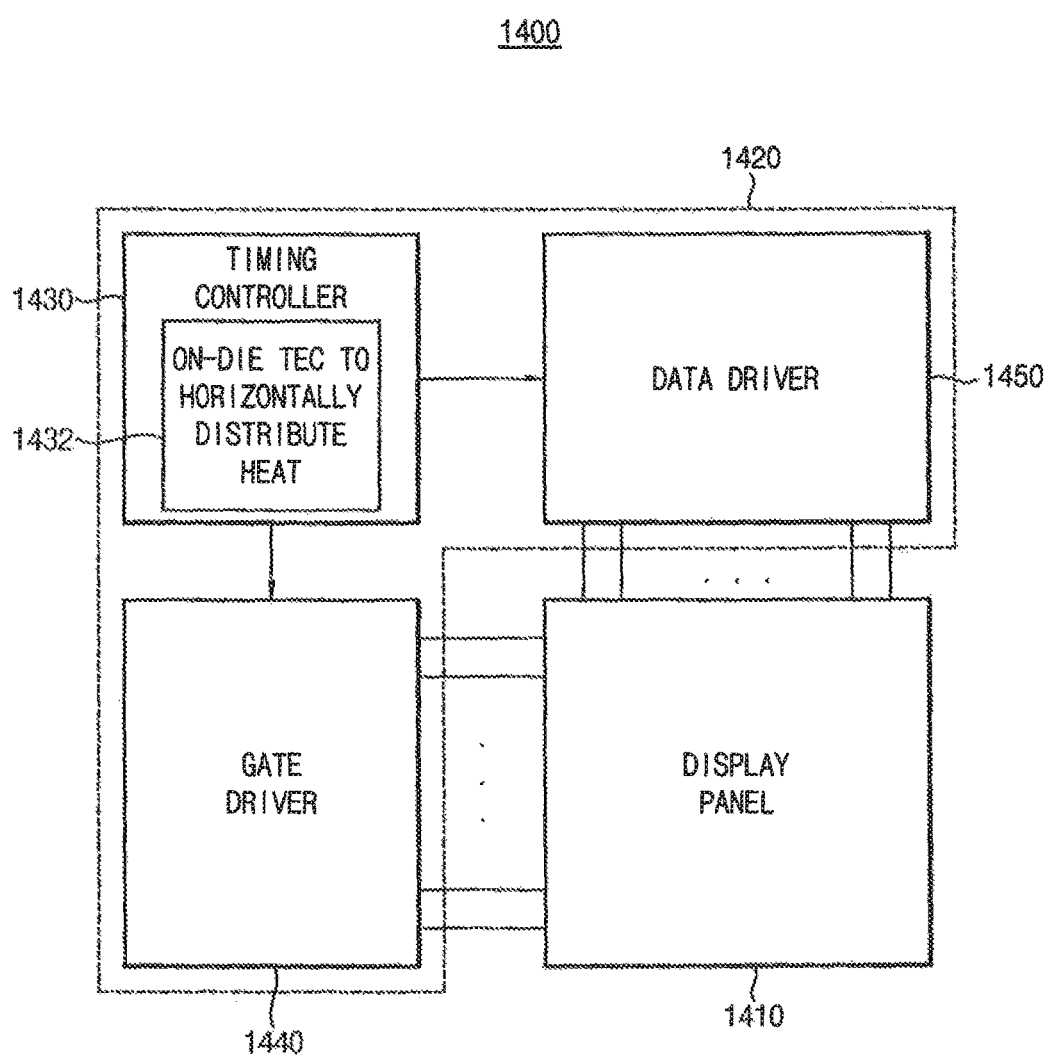
FIG. 17 is a block diagram of a display system according to exemplary embodiments.

FIG. 17 is a block diagram of a display system according to exemplary embodiments.

Referring to FIG. 17, a display system 1400 includes a display panel 1410 and a display driver integrated circuit (DDI) 1420.

The display panel 1410 may include a plurality of gate lines and a plurality of data lines. The display panel 1410 may include a pixel array having a plurality of pixels arranged as a matrix. Each pixel may correspond to a region in which one of the gate lines and one of the data lines intersect. The display panel 1410 may be one of a liquid crystal display (LCD) panel, a light emitting diode (LED) display panel, an organic LED (OLED) display panel, a field emission display (FED) panel, etc.

The DDI 1420 may control an operation of the display panel 1410. The DDI 1420 may include a timing controller 1430, a gate driver 1440 and a data driver 1450.

The timing controller 1430 may receive an image data signal and a system control signal from an external device, such as a graphics processing unit (GPU), and may generate a gate driver control signal, a data driver control signal and data based on the image data signal and the system control signal. The gate driver 1440 may selectively enable the gate lines of the display panel 1410 based on the gate driver control signal to select a row of the pixel array. The data driver 1450 may apply a plurality of driving voltages to the data lines of the display panel 1410 based on the data driver control signal and the data. The display panel 1410 may be driven by the gate driver 1440 and the data driver 1450. An image corresponding to the image data signal may be displayed on the display panel 1410.

The timing controller 1430 may be implemented as a semiconductor chip according to exemplary embodiments. For example, the timing controller 1430 may include an on-die thermoelectric element 1432 which may be implemented by examples such as those described above with reference to FIGS. 1A, 1B, 5, 8, 11, 12, 13, 14A, 14B and 15. The on-die thermoelectric element 1432 integrated within the timing controller chip may selectively perform a horizontal heat distributing operation and an energy generating operation. Accordingly, hot spots in the timing controller chip may be effectively eliminated without increasing a thickness of the timing controller chip, and the timing controller chip may have an improved energy efficiency.

Figure 18:
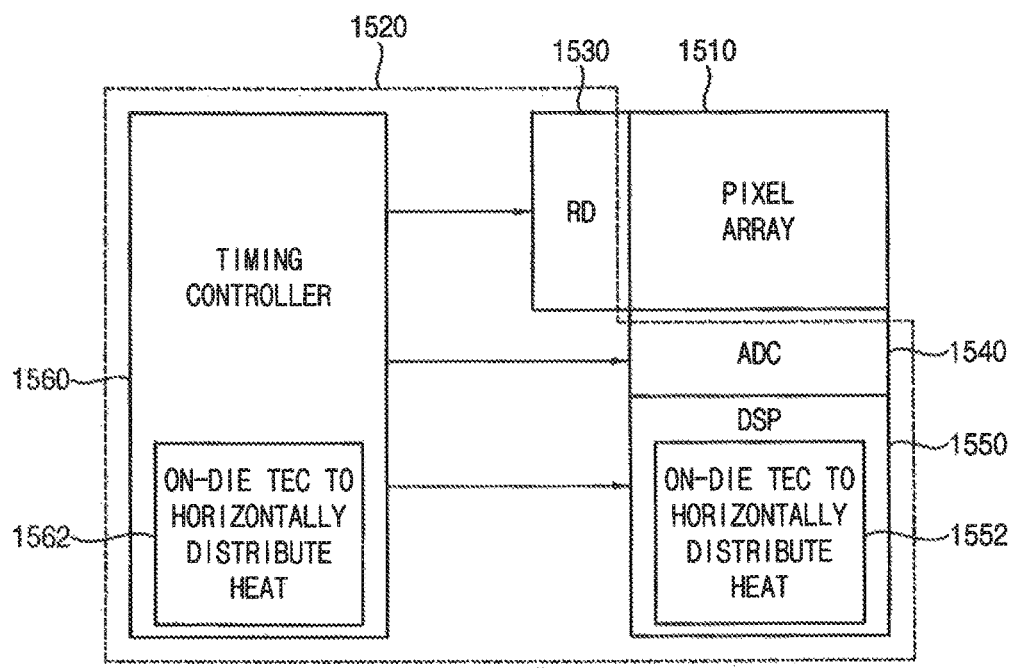
FIG. 18 is a block diagram of an image sensor system according to exemplary embodiments.

FIG. 18 is a block diagram of an image sensor system according to exemplary embodiments.

Referring to FIG. 18, an image sensor system 1500 includes a pixel array 1510 and a signal processing unit 1520.

The pixel array 1510 may generate electric signals based on incident light. The pixel array 1510 may include a plurality of unit pixels arranged as a matrix. For example, the pixel array 1510 may include a plurality of color pixels that can provide color image information and/or a plurality of depth pixels that can provide depth information, which is information about a distance or a depth of an object from the image sensor system 1500. If the pixel array 1510 includes a plurality of depth pixels, the image sensor system 1500 may further include a light source module that emits light focused on the object.

The signal processing unit 1520 may generate image data based on the electric signals. The signal processing unit 1520 may include a row driving unit 1530, an analog-to-digital converting (ADC) unit 1540, a digital signal processing (DSP) unit 1550 and a timing controller 1560.

The row driving unit 1530 may be connected with each row of the pixel array 1510. The row driving unit 1530 may generate driving signals to drive each row. The ADC unit 1540 may be connected with each column of the pixel array 1510. The ADC unit 1540 may convert analog signals received from the pixel array 1510 into digital signals. According to exemplary embodiments, the ADC unit 1540 may include a correlated double sampling (CDS) unit for extracting an effective signal component. In some exemplary embodiments, the CDS unit may perform an analog double sampling that extracts the effective signal component based on a difference between an analog reset signal that includes a reset component and an analog data signal that includes a signal component. In other exemplary embodiments, the CDS unit may perform a digital double sampling that converts the analog reset signal and the analog data signal into two digital signals and extracts the effective signal component based on a difference between the two digital signals. In still other exemplary embodiments, the CDS unit may perform a dual correlated double sampling that performs both the analog double sampling and the digital double sampling. The DSP unit 1550 may receive the digital signals from the ADC unit 1540, and may perform image data processing on the digital signals. For example, the DSP unit 1550 may perform one or more of image interpolation, color correction, white balance, gamma correction, color conversion, etc. The timing controller 1560 may control the row driving unit 1530, the ADC unit 1540 and the DSP unit 1550 by providing control signals, such as a clock signal, a timing control signal, etc.

Each of the DSP unit 1550 and the timing controller 1560 may be implemented as a semiconductor chip according to exemplary embodiments. For example, the DSP unit 1550 and the timing controller 1560 may include on-die thermoelectric elements 1552 and 1562 which may be implemented by examples such as those described above with reference to FIGS. 1A, 1B, 5, 8, 11, 12, 13, 14A, 14B and 15. The on-die thermoelectric elements 1552 and 1562 integrated within the DSP chip and the timing controller chip may selectively perform a horizontal heat distributing operation and an energy generating operation. Accordingly, hot spots in the DSP chip and the timing controller chip may be effectively eliminated without increasing thicknesses of the DSP chip and the timing controller chip, and the DSP chip and the timing controller chip may have an improved energy efficiency.

Figure 19:
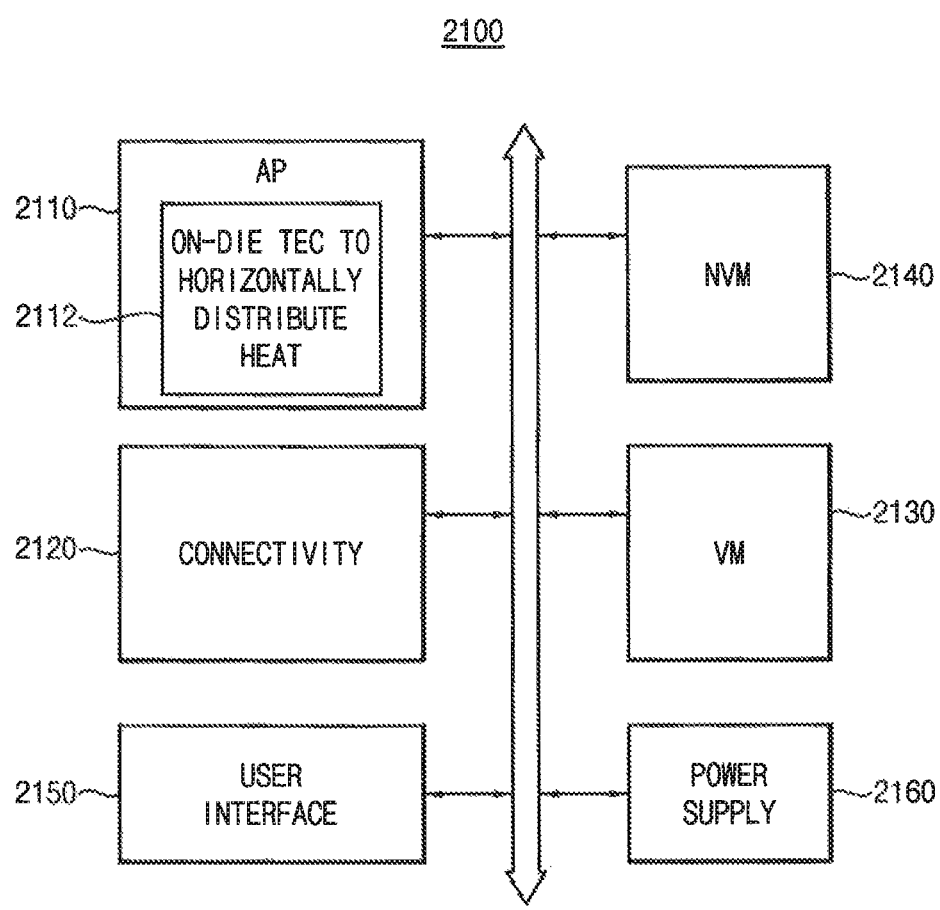
FIG. 19 is a block diagram of a mobile system according to exemplary embodiments.

FIG. 19 is a block diagram of a mobile system according to exemplary embodiments.

Referring to FIG. 19, a mobile system 2100 includes an application processor (AP) 2110, a connectivity unit 2120, a volatile memory device 2130, a nonvolatile memory device 2140, a user interface 2150 and a power supply 2160. According to exemplary embodiments, the mobile system 2100 may be any mobile system, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc.

The AP 2110 may execute applications, such as an internet browser, a game application, a video player application, etc. According to exemplary embodiments, the AP 2110 may include a single processor core or a plurality of processor cores. For example, the AP 2110 may be a multi-core processor, such as a dual-core processor, a quad-core processor, a hexa-core processor, etc. In some exemplary embodiments, the AP 2110 may further include a cache memory located inside or outside the AP 2110.

The connectivity unit 2120 may perform wired or wireless communication with an external device. For example, the connectivity unit 2120 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The connectivity unit 2120 may include a baseband chipset.

The volatile memory device 2130 may store an instruction/data processed by the AP 2110, or may serve as a working memory. For example, the volatile memory device 2130 may be implemented by a DRAM, a SRAM, a mobile DRAM, a dual data rate (DDR) synchronous DRAM (SDRAM), a low power DDR (LPDDR) SDRAM, a graphic DDR (GDDR) SDRAM, a rambus DRAM (RDRAM), etc.

The nonvolatile memory device 2140 may store a boot image for booting the mobile system 2100. For example, the nonvolatile memory device 2140 may be implemented by an EEPROM, a flash memory, a PRAM, a RRAM, a MRAM, a FRAM, a NFGM, a PoRAM, etc.

The user interface 2150 may include at least one input device, such as a keypad, a touch screen, etc., and at least one output device, such as a display device, a speaker, etc. The power supply 2160 may supply the mobile system 2100 with power. In some exemplary embodiments, the mobile system 2100 may further include a camera image processor (CIS) storage device, such as a memory card, a solid state drive (SSD), a CD-ROM, etc.

The AP 2110 may be implemented as a semiconductor chip according to exemplary embodiments. For example, the AP 2110 may include an on-die thermoelectric element 2112 which may be implemented by examples such as those described above with reference to FIGS. 1A, 1B, 5, 8, 11, 12, 13, 14A, 14B and 15. The on-die thermoelectric element 2112 integrated within the AP chip may selectively perform a horizontal heat distributing operation and an energy generating operation. Accordingly, hot spots in the AP chip may be effectively eliminated without increasing a thickness of the AP chip, and the AP chip may have an improved energy efficiency.

According to exemplary embodiments, the mobile system 2100 and/or components of the mobile system 2100 may be packaged in various forms, such as a package on package (PoP), a ball grid arrays (BGA), a chip scale packages (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi chip package (MCP), a wafer-level fabricated package (WFP), or a wafer-level processed stack package (WSP).

Figure 20:
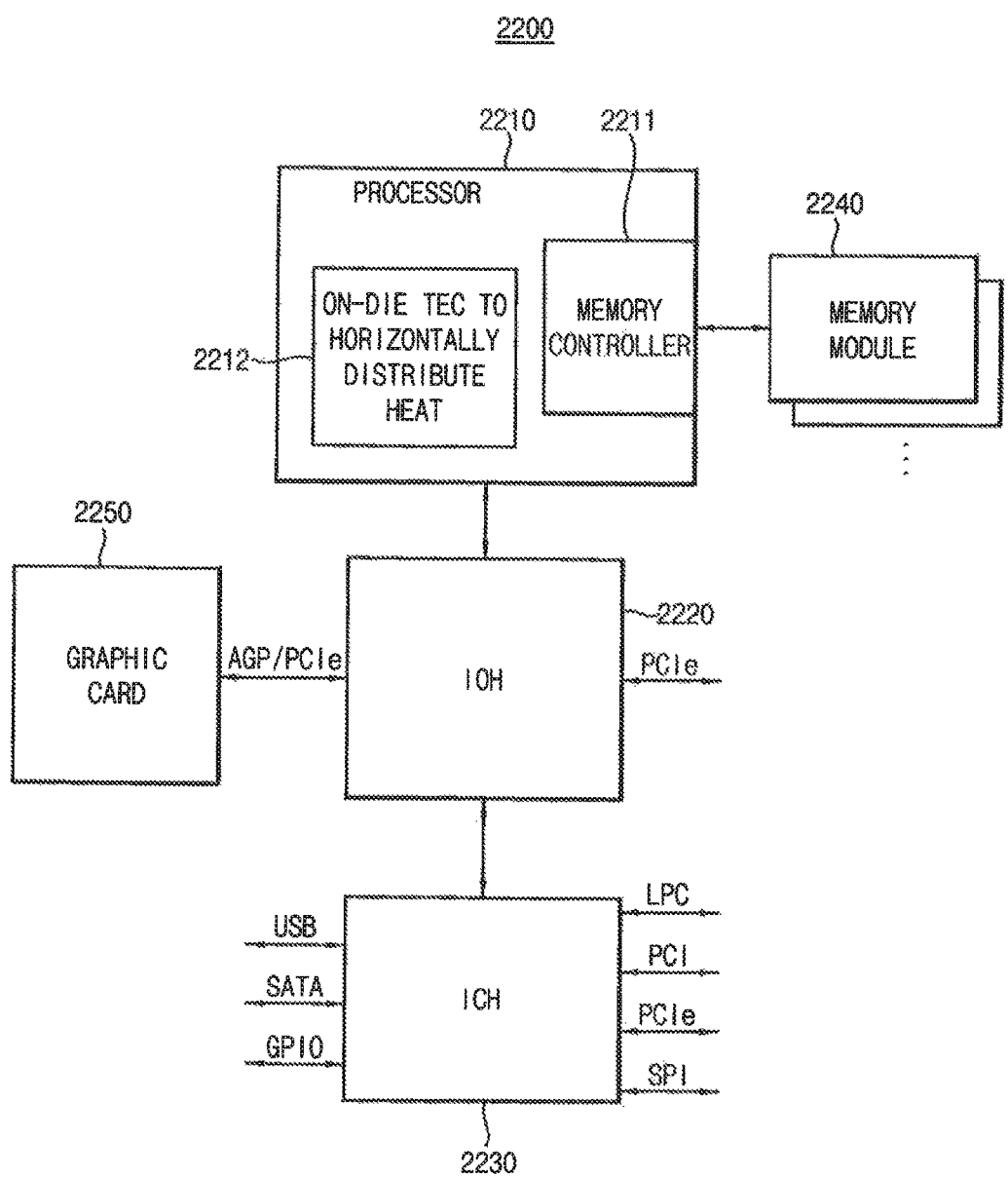
FIG. 20 is a block diagram of a computing system according to exemplary embodiments.

FIG. 20 is a block diagram of a computing system according to exemplary embodiments.

Referring to FIG. 20, a computing system 2200 includes a processor 2210, an input/output (I/O) hub 2220, an I/O controller hub 2230, at least one memory module 2240 and a graphic card 2250. According to exemplary embodiments, the computing system 2200 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 2210 may perform specific calculations or tasks. For example, the processor 2210 may be a microprocessor, a central processing unit (CPU), a digital signal processor, etc. According to exemplary embodiments, the processor 2210 may include a single processor core or a plurality of processor cores. For example, the processor 2210 may be a multi-core processor, such as a dual-core processor, a quad-core processor, a hexa-core processor, etc. Although FIG. 20 illustrates an example of the computing system 2200 that includes one processor 2210, according to exemplary embodiments, the computing system 2200 may include a plurality of processors. In some exemplary embodiments, the processor 2210 may further include a cache memory located inside or outside the processor 2210.

The processor 2210 may include a memory controller 2211 that controls an operation of the memory module 2240. The memory controller 2211 included in the processor 2210 may be referred to as an integrated memory controller (IMC). A memory interface between the memory controller 2211 and the memory module 2240 may be implemented by one channel that includes a plurality of signal lines, or by a plurality of channels. Each channel may be coupled to at least one memory module 2240. In some exemplary embodiments, the memory controller 2211 may be included in the I/O hub 2220. The I/O hub 2220 with the memory controller 2211 may be referred to as a memory controller hub (MCH). The memory module 2240 may include a plurality of nonvolatile memory devices and/or a plurality of volatile memory devices that store data received from the memory controller 2211.

The I/O hub 2220 may manage data transfered between the processor 2210 and devices, such as the graphic card 2250. The I/O hub 2220 may be coupled to the processor 2210 via at least one of various interfaces, such as a front side bus (FSB), a system bus, a HyperTransport, a lightning data transport (LDT), a QuickPath interconnect (QPI), a common system interface (CSI), etc. Although FIG. 20 illustrates an example of a computing system 2200 that includes one I/O hub 2220, according to exemplary embodiments, the computing system 2200 may include a plurality of I/O hubs.

The I/O hub 2220 may provide various interfaces with the devices. For example, the I/O hub 2220 may provide an accelerated graphics port (AGP) interface, a peripheral component interface-express (PCIe), a communications streaming architecture (CSA) interface, etc.

The graphics card 2250 may be coupled to the I/O hub 2220 via an AGP or a PCIe. The graphic card 2250 may control a display device that displays an image. The graphic card 2250 may include an internal processor and an internal memory to process the image. In some exemplary embodiments, the input/output hub 2220 may include an internal graphics device along with or instead of the graphics card 2250. The internal graphics device may be referred to as an integrated graphics, and an I/O hub that includes the memory controller and the internal graphic device may be referred to as a graphics and memory controller hub (GMCH).

The I/O controller hub 2230 may perform data buffering and interface arbitration to efficiently operate various system interfaces. The I/O controller hub 2230 may be coupled to the I/O hub 2220 via an internal bus. For example, the I/O controller hub 2230 may be coupled to the I/O hub 2220 via at least one of various interfaces, such as a direct media interface (DMI), a hub interface, an enterprise Southbridge interface (ESI), PCIe, etc.

The I/O controller hub 2230 may provide various interfaces with peripheral devices. For example, the I/O controller hub 2230 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

The processor 2210 may be implemented as a semiconductor chip according to exemplary embodiments. For example, the processor 2210 may include an on-die thermoelectric element 2212 which may be implemented by examples such as those described above with reference to FIGS. 1A, 1B, 5, 8, 11, 12, 13, 14A, 14B and 15. The on-die thermoelectric element 2212 integrated within the processor chip may selectively perform a horizontal heat distributing operation and an energy generating operation. Accordingly, hot spots in the processor chip may be effectively eliminated without increasing a thickness of the processor chip, and the processor chip may have an improved energy efficiency.

In some exemplary embodiments, the processor 2210, the I/O hub 2220 and the I/O controller hub 2230 may be implemented as separate chipsets or separate integrated circuits. In other embodiments, at least two of the processor 2210, the I/O hub 2220 and the I/O controller hub 2230 may be implemented as one chipset.

The above described embodiments may be used in any device or system that includes a semiconductor chip, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of the present inventive concept. Accordingly, all such modifications are intended to be included within the scope of the present inventive concept as defined in the appended claims.

We claim:

1. A semiconductor chip comprising: a semiconductor circuit layer and a first semiconductor thermoelectric layer disposed on a substrate, the semiconductor circuit layer includes a first circuit and a second circuit disposed horizontally in a first direction, wherein a first on-die thermoelectric element is in direct contact with the semiconductor circuit layer, wherein the first semiconductor thermoelectric layer is disposed above the semiconductor circuit layer including the first circuit and the second circuit, wherein the first semiconductor thermoelectric layer is disposed directly on upper and side surfaces of the first on-die thermoelectric element, and the first on-die thermoelectric element is configured to distribute heat generated at the first circuit horizontally in the first direction toward the second circuit; and a second on-die thermoelectric element disposed directly on an upper surface of the first semiconductor thermoelectric layer, wherein a second thermoelectric layer is disposed directly on upper and side surfaces of the second on-die thermoelectric element.

2. The semiconductor chip of claim 1, wherein the first on-die thermoelectric element is configured to generate electricity based on a temperature differential between the first circuit and the second circuit.

3. The semiconductor chip of claim 2, wherein the first on-die thermoelectric element includes first and second electrodes corresponding to the first circuit and the second circuit, respectively.

4. The semiconductor chip of claim 1, further including a temperature sensor configured to measure temperature at the first circuit, wherein the first on thermoelectric element is activated to distribute heat in the first direction when the temperature at the first circuit is greater than a reference temperature.

5. The semiconductor chip of claim 1, further including a first temperature sensor and a second temperature sensor configured to measure temperature at the first circuit and the second circuit, respectively, wherein the first on-die thermoelectric element is activated to distribute heat in the first direction when a temperature differential between the temperature at the first circuit and the temperature at the second circuit is greater than a reference differential value.

6. The semiconductor chip of claim 1, wherein the first on-die thermoelectric element is activated to distribute heat in the first direction based on a reference workload of the first circuit.

7. The semiconductor chip of claim 2, further including a controller configured to provide mode control signals including a heat distribution mode and a power generation mode, the heat distribution mode providing an activating voltage to activate the first on-die thermoelectric element to distribute heat in the first direction, and the power generation mode to provide electricity generated by the first on-die thermoelectric element.

8. The semiconductor chip of claim 7, wherein the electricity generated is provided is provided to another circuit in the semiconductor chip or to recharge a power source.

9. The semiconductor chip of claim 1, wherein the second on-die thermoelectric element is configured to generate electricity based on the temperature difference between the first circuit and the second circuit.

10. The semiconductor chip of claim 1, wherein the first on-die thermoelectric element is configured to distribute heat in the first direction and the second on-die thermoelectric element is configured to generate electricity based on a temperature differential between a third circuit and a fourth circuit.

11. The semiconductor chip of claim 1, wherein the first circuit is one of an application processor (AP), a microprocessor or a central processing unit (CPU).

12. The semiconductor chip of claim 1, wherein the second on-die thermoelectric element includes a plurality of electrodes configured to perform horizontal heat distributing operation or energy generating operation.

13. A semiconductor chip comprising: a semiconductor circuit layer and a first semiconductor thermoelectric layer disposed on a substrate, the semiconductor circuit layer includes a first circuit and a second circuit disposed horizontally in a first direction, wherein the first semiconductor thermoelectric layer is disposed directly on upper and side surfaces of a first on-die thermoelectric element, wherein the first semiconductor thermoelectric layer is disposed above the circuit layer including the first circuit and the second circuit, and the first on-die thermoelectric element is configured to generate electricity based on a temperature differential at the first circuit and the second circuit; and a second on-die thermoelectric element disposed directly on the first semiconductor thermoelectric layer, wherein a second thermoelectric layer is disposed directly on an upper surface of the second on-die thermoelectric element, and wherein the second thermoelectric layer is disposed directly on upper and side surfaces of an electrode of the second on-die thermoelectric element.

14. The semiconductor chip of claim 13, wherein the second on-die thermoelectric element is configured to distribute heat generated at the first circuit horizontally in the first direction toward the second circuit.

15. The semiconductor chip of claim 13, wherein a bottom surface of the first on-die thermoelectric element is in direct contact with an upper surface of the semiconductor circuit layer.

16. A semiconductor chip comprising:
a semiconductor circuit layer;
a plurality of active elements in the semiconductor circuit layer, wherein the active elements of the plurality of active elements are configured to discharge heat; and
a first on-die thermoelectric element disposed directly on the semiconductor circuit layer, wherein a surface of the first on-die thermoelectric element facing the semiconductor circuit layer is substantially continuously parallel with a surface of the semiconductor circuit layer facing the first on-die thermoelectric element, and wherein substantially an entire surface of the first on-die thermoelectric element facing the semiconductor circuit layer is in direct contact with the semiconductor circuit layer, wherein a first semiconductor thermoelectric layer is disposed directly on an upper and side surfaces of the first on-die thermoelectric element; and
a second on-die thermoelectric element disposed directly on an upper surface of the first semiconductor thermoelectric layer, wherein a second thermoelectric layer is disposed directly on upper and side surfaces of the second on-die thermoelectric element.

17. The semiconductor chip of claim 16,
wherein the plurality of active elements include at least one first active element in a first area of the semiconductor circuit layer and at least one second active element in a second area of the circuit layer spaced apart from the first area, and
wherein the first on-die thermoelectric element comprises a first electrode adjacent to the first area of the circuit layer and a second electrode adjacent to the second area of the circuit layer.

\* \* \* \* \*